(12) United States Patent
Wang et al.

(10) Patent No.: US 10,655,714 B2
(45) Date of Patent: May 19, 2020

(54) ROTARY MOTION STRUCTURE

(71) Applicant: FIVETECH TECHNOLOGY INC., New Taipei (TW)

(72) Inventors: Ting-Jui Wang, New Taipei (TW); Hung-Yi Hsu, New Taipei (TW)

(73) Assignee: FIVETECH TECHNOLOGY INC. (TW)

( * ) Notice: Subject to any disclaimer, the term of this patent is extended or adjusted under 35 U.S.C. 154(b) by 0 days.

(21) Appl. No.: 15/612,148

(22) Filed: Jun. 2, 2017

(65) Prior Publication Data
US 2017/0350477 A1    Dec. 7, 2017

(30) Foreign Application Priority Data
Jun. 4, 2016    (TW) .............................. 105208474 U

(51) Int. Cl.
*F16H 21/44*    (2006.01)
*H05K 7/14*    (2006.01)

(52) U.S. Cl.
CPC ............ *F16H 21/44* (2013.01); *H05K 7/1409* (2013.01); *H05K 7/1427* (2013.01)

(58) Field of Classification Search
CPC ....... F16H 21/44; F16H 35/18; H05K 7/1427; H05K 7/1409; G05G 5/04; G05G 5/05; G05G 1/12; G05G 1/10; G05G 1/04; G05G 1/08; Y10T 16/458; Y10T 292/57; Y10T 74/20852
USPC .......................................................... 16/374
See application file for complete search history.

(56) References Cited

U.S. PATENT DOCUMENTS

| | | | | |
|---|---|---|---|---|
| 2,899,841 A * | 8/1959 | Melloy | ..................... | G05G 1/12 74/548 |
| 3,701,286 A * | 10/1972 | Donnelly | ............... | B23Q 16/04 74/142 |
| 4,571,111 A * | 2/1986 | Keogh | ..................... | F16D 1/072 403/282 |
| 4,598,614 A * | 7/1986 | Kipp | ........................ | G05G 1/12 81/58.3 |
| 5,879,100 A * | 3/1999 | Winkler | .................... | F16D 1/12 16/422 |
| 8,292,494 B2 * | 10/2012 | Rosa | .................. | G05D 23/1902 116/292 |
| 9,032,560 B2 * | 5/2015 | Lambert | ................... | E03D 5/02 4/324 |
| 9,346,374 B2 * | 5/2016 | Sayama | ............... | B60N 2/2245 |
| 9,435,103 B2 * | 9/2016 | Lee | .......................... | E05F 1/063 |

(Continued)

FOREIGN PATENT DOCUMENTS

DE    102010061039 A1 *    6/2012    ............... G05G 1/10

*Primary Examiner* — Patrick Cicchino
(74) *Attorney, Agent, or Firm* — Schmeiser, Olsen & Watts, LLP

(57) ABSTRACT

A rotary motion structure comprises a limiting member and a rotating member. The limiting member defines a mounting portion; and the rotating member is rotatably provided on the limiting member and includes a shaft portion, which is provided through the mounting portion. Accordingly, the rotary motion structure described above is preferably applied to form a handle device having a positioning function, in which the rotating member is rotated relative to the limiting member so that the rotating member can have the positioning efficacy of automatic positioning, frictional positioning, temporary positioning, or fixed positioning.

7 Claims, 55 Drawing Sheets

(56) References Cited

U.S. PATENT DOCUMENTS

| | | | | |
|---|---|---|---|---|
| 9,989,154 | B2* | 6/2018 | Gutmann | F16K 1/221 |
| 10,174,861 | B2* | 1/2019 | Brubaker | F16H 53/02 |
| 2016/0348836 | A1* | 12/2016 | Wyslucha | A61G 13/10 |
| 2017/0022857 | A1* | 1/2017 | Junker | F01L 1/185 |
| 2017/0128312 | A1* | 5/2017 | Park | A61H 1/0244 |
| 2017/0293317 | A1* | 10/2017 | Kosaka | B60Q 1/0082 |

* cited by examiner

ROTARY MOTION STRUCTURE

CROSS-REFERENCE TO RELATED APPLICATION

This non-provisional application claims priority under 35 U.S.C. § 119(a) on Patent Application No(s). 105208474 filed in Taiwan, R.O.C. on Jun. 4, 2016, the entire contents of which are hereby incorporated by reference.

FIELD OF THE INVENTION

The present invention relates to a rotary motion structure, and more particularly to a rotary motion structure applied to a positioning handle.

BACKGROUND OF THE INVENTION

In the prior art, the object such as the board or the circuit board is placed in the casing without any special design to assist in the placement thereof, which is inconvenient.

SUMMARY OF THE INVENTION

It is an object of the present invention to provide a rotary motion structure having a function of automatically ejecting and positioning.

To achieve the above and other objects, the present invention discloses a rotary motion structure, which comprises a limiting member having a mounting portion; and a rotating member rotatably provided at the limiting member. The rotating member includes a shaft portion, which is provided at the mounting portion.

In the rotary motion structure described above, the limiting member is provided with a first limiting portion or the rotating member is provided with a second limiting portion. While the first limiting portion or the second limiting portion corresponds to each other, the first limiting portion or the second limiting portion are interfering or buckling with each other or interfering or buckling with other structures to temporarily fix, temporarily limit, fix, or limit the rotating member. Alternatively, the limiting member is provided with an engaging portion, which is engaged with a first object by riveting, expanding, locking, welding, bonding, or buckling, or integrally formed with the first object.

In the rotary motion structure described above, the first limiting portion is provided with a limiting region or a guide region, which is used to guide an acting direction of the second limiting portion, and the second limiting portion is provided with a limiting region or a guide region, which is used to guide an acting direction of the first limiting portion.

In the rotary motion structure described above, when the first limiting portion or the second limiting portion is a protruding structure, the limiting region is a retaining wall at a side, and the guide region is a bevel, an arc surface or a curved surface adjacent to a side of the limiting region so that the second limiting portion or the first limiting portion may move or slide to the limiting region along a bottom surface of the guide region.

In the rotary motion structure described above, the rotating member includes a head portion, which is integrated, combined, or formed integrally with the shaft portion, or the rotating member includes an operating portion, or the rotating member includes an acting portion, in which the operating portion, the acting portion, the shaft portion, or the head portion may be formed integrally or assembled together, or the rotating member includes an abutting portion, which is connected to the acting portion and has a protrusion, a recess, a bevel, an arc surface, a curved surface, a step, a groove, a recessed hole, a through hole, a cylinder or a sheet.

In the rotary motion structure described above, an elastic member is further provided, and the elastic member is provided at the shaft portion with two ends thereof abutting against the limiting member and the rotating member respectively, or the elastic member is disposed inside or outside the limiting member or the rotating member with two ends thereof also abutting against the limiting member and the rotating member respectively.

In the rotary motion structure described above, the shaft portion is provided with a stop flange, which is located on one end of the shaft portion opposite the head portion for stopping against the elastic member or the limiting member.

In the rotary motion structure described above, the limiting member has an interfering portion provided at a wall surface of the mounting portion of the limiting member or on the outer edge of the limiting member for interfering with the stop flange, the head portion, or the elastic member mutually.

In the rotary motion structure described above, the limiting member or the mounting portion of the limiting member includes a first abutting portion, and the rotating member or the head portion of the rotating member includes a second abutting portion, with two ends of the elastic member being coupled with or abutted against or combined with the first abutting portion or the second abutting portion respectively.

In the rotary motion structure described above, there is further comprising at least a positioning portion, which is provided at the limiting member or the rotating member to position the rotating member.

In the rotary motion structure described above, the positioning portion has a positioning piece, a positioning elastic piece, and a limiting groove, or the positioning portion has a positioning piece, a positioning elastic piece, a limiting groove, and a limiting body, in which the positioning piece or the positioning elastic piece is confined to the limiting groove, or the positioning elastic piece abuts against the positioning piece, or a portion of the positioning piece is exposed to the limiting groove to position the rotating member.

In the rotary motion structure described above, the limiting member has an interference positioning portion for positioning a second object by interference, or the limiting member has a shoulder for supporting the second object.

In the rotary motion structure described above, the positioning portion comprises at least a positioning piece, an elastic piece, a limiting groove, or a control portion.

In the rotary motion structure described above, the second limiting portion of the rotating member is a limiting buckling portion and the first limiting portion of the limiting member is a limited buckling portion mutually buckling or interfering with the limiting buckling portion.

In the rotary motion structure described above, an abutment elastic member is provided between the rotating member or the limiting member for allowing the rotating member to be abutted upon a disposed location or one end of a lateral movement space.

In the rotary motion structure described above, the rotating member is further provided with a pushing member, which is movably combined with or limited to or interfered with the limiting member, and the limiting member is provided with a butting portion for movably combined with or limited to or interfered with the pushing member, which includes a pressing portion at one end of the rotating member, an actuating arm connecting the pressing portion, and the connecting actuating arm has a fastening portion movably combined with or limited to or interfered with the butting portion.

In the rotary motion structure described above, there is further comprising a positioning piece provided at the rotating member and a butting portion provided at the limiting member for movably combining with, being limited to, interfering with, or fastening the positioning piece.

In the rotary motion structure described above, the rotating member has a receiving space for configuring the limiting member or the positioning member.

In the rotary motion structure described above, the positioning member includes a push rod, an actuating arm, and an engaging body connecting the push rod with the actuating arm, in which the push rod has a pressing portion provided at one end of the rotating member or a shaft connecting the engaging body, and the actuating arm has an extension portion connecting the engaging body as well as a corresponding portion connecting the extension portion and movably combining with, being limited to, interfering with, or fastening the limiting member.

In the rotary motion structure described above, the positioning member includes a pressing portion disposed at one end of the rotating member and an actuating arm connecting the pressing portion, in which the actuating arm has a bent portion corresponding to the limiting member, and a corresponding portion provided at the bent portion and movably combined with the butting portion.

In the rotary motion structure described above, the limiting member is provided with a butting portion for movably combined with the positioning member, in which the positioning member includes a pressing portion at one end of the rotating member, an actuating arm connecting the pressing portion, a corresponding portion connecting the actuating arm and movably combined with the butting portion, and an engaging body provided between the rotating member and the positioning member, and the positioning member is movably engaged with the rotating member through the engaging body.

In the rotary motion structure described above, there is further comprising a first pushing piece provided between the rotating member and the shaft portion, or a second pushing piece provided between the rotating member and a limiting piece, wherein the first pushing piece or the second pushing piece is an elastic component, and the positioning piece is provided at the rotating member and movably engaged with the limiting piece.

In the rotary motion structure described above, the head portion and the shaft portion are fixed by an engaging piece.

In the rotary motion structure described above, the elastic member is a torsion spring, two ends of which are fixed at the limiting member and the rotating member respectively for causing the rotating member to rotate elastically about the shaft portion due to the elastic force of torsion.

In the rotary motion structure described above, the positioning member is assembled with dislocation or wedged in the rotating member.

In the rotary motion structure described above, the rotating member or the positioning member is provided with an action portion for the positioning member to carry out a laterally or axially limited movement in the action portion.

In the rotary motion structure described above, the elastic member is a coil spring, a torsion spring, a shrapnel, or an elastic cylinder.

In the rotary motion structure described above, an elastic portion is provided between the positioning member and the rotating member or between the positioning member and the limiting member.

In the rotary motion structure described above, an elastic portion is provided between the pushing member and the rotating member or the limiting member.

In the rotary motion structure described above, the elastic portion is a coil spring, a torsion spring, a shrapnel, or an elastic cylinder.

In the rotary motion structure described above, the pressing portion and the actuating arm are formed through mutual engagement or formed integrally.

Accordingly, the rotary motion structure described above is preferably applied to form a handle device having a positioning function, in which the rotating member is rotated relative to the limiting member by the elastic member so that the rotating member can have the efficacy of automatic positioning.

DETAILED DESCRIPTION OF THE EMBODIMENTS

In order to understand the objects, features, and effects of the present invention adequately, a more detailed description of the invention will be set forth below by reference to the particular embodiments in conjunction with the appended drawings:

With reference to FIGS. 1-5, which are schematic views of the rotary motion structure 1 according to the first embodiment of the present invention.

Figure 1:
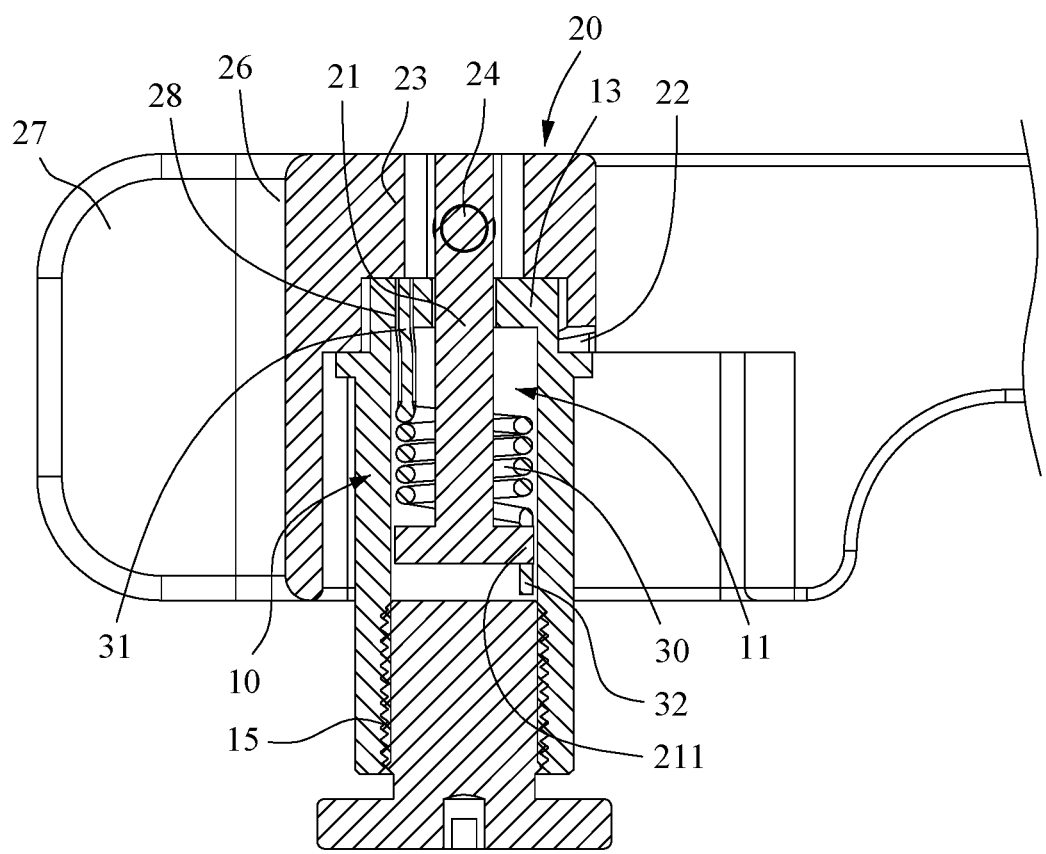
FIG. 1 is a schematic cross-sectional view of the rotary motion structure according to the first embodiment of the present invention.

As shown in FIG. 1, which is a schematic cross-sectional view of the rotary motion structure 1. The rotary motion structure 1 comprises a limiting member 10, a rotating member 20, and an elastic member 30. The limiting member 10 has a mounting portion 11. The rotating member 20 is rotatably provided at the limiting member and includes a shaft portion 21, which is provided through the mounting portion 11. The elastic member 30 is provided on the shaft portion 21 and two ends thereof elastically abut against the limiting member 10 and the rotating member 20, respectively.

The elastic member 30 is provided to make the rotating member 20 rotate automatically or passively, or be positioned temporarily or fixedly. The elastic member 30 may be disposed inside or outside the limiting member 10 or the rotating member 20.

The mounting portion 11 may be a through hole, a recessed hole, a groove, a recess, a protrusion, a plane, an arc, a bevel, or a curved surface.

In this way, when an external force causes the rotating member 20 to rotate about the shaft portion 21 in a direction (e.g., a clockwise direction), the elastic member 30 is compressed or rubbed by movement, and when the external force is removed, the elastic member 30 recovers its original length or stops being rubbed by the movement and then exerts an elastic force on the limiting member 10 and the rotating member 20 so that the rotating member 20 is rotated about the shaft portion 21 in an opposite direction (e.g. a counterclockwise direction) or fixed by the abutment of the elastic force.

In this embodiment, the limiting member 10 may have an interfering portion 13 provided at the wall surface of the limiting member 10 facing the mounting portion 11 or on the outer edge of the limiting member 10 for interfering with the stop flange 211, the head portion 23, or the elastic member 30 mutually. Also, the shaft portion 21 may be provided with a stop flange 211, which is located on one end of the shaft portion 21 opposite the head portion 23 for stopping against the elastic member 30 or the limiting member 10 such that the elastic member 30 is disposed between the stopper flange 211 and the interfering portion 13, or the shaft portion 21 is not detached from the limiting member 10.

Figure 2:
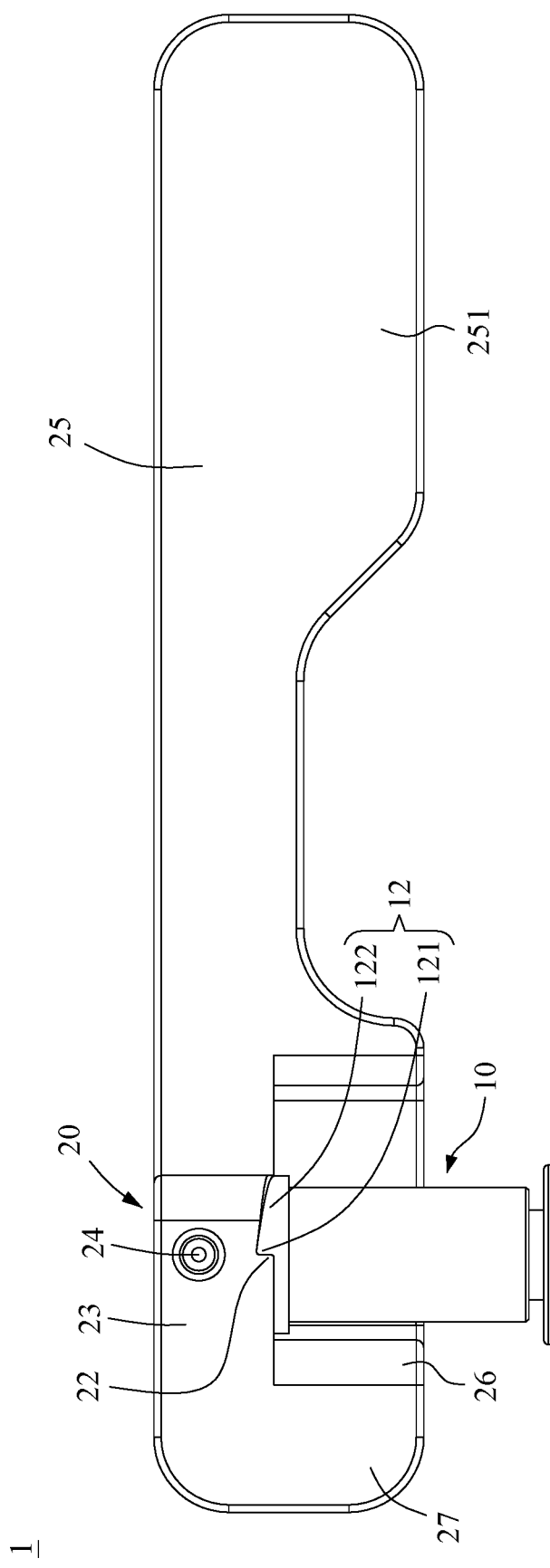
FIG. 2 is a schematic view of the rotary motion structure according to the first embodiment of the present invention.
Figure 3:
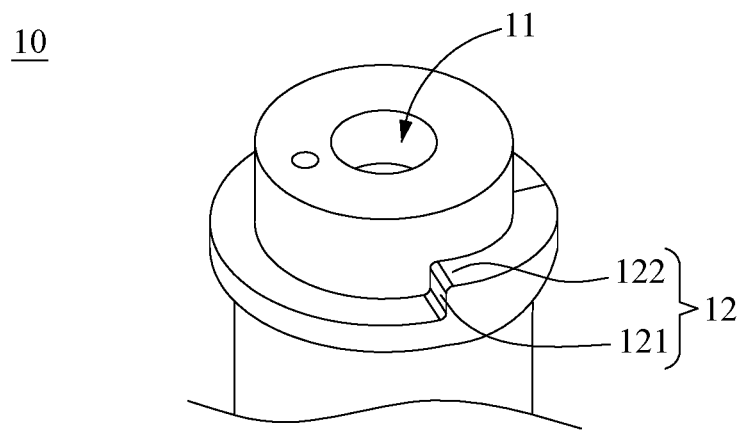
FIG. 3 is a schematic view of the limiting member according to the first embodiment of the present invention.

As shown in FIGS. 2 and 3, the limiting member 10 is provided with a first limiting portion 12 and the rotating member 20 is provided with a second limiting portion 22. When the positions of the first limiting portion 12 and the second limiting portion 22 correspond to each other, the first limiting portion 12 and the second limiting portion 22 interfere with each other to temporarily fix or fix the rotating member 20. The mounting portion 11 of the limiting member 10 and the first limiting portion 12 are formed integrally, assembled fixedly, or assembled movably, and the rotating member 20 and the second limiting portion 22 may be formed integrally, assembled fixedly, or assembled movably. In this embodiment, when the positions of the first limiting portion 12 and the second limiting portion 22 correspond to each other such that the rotating member 20 is temporarily fixed, the elastic member 30 is in a compressed state.

As shown in FIG. 3, the first limiting portion 12 is provided with a limiting region 121 and a guide region 122 adjacent to or not adjacent to the limiting region 121, and the guide region 122 is used to guide the acting direction of the second limiting portion 22. In this embodiment, the first limiting portion 12 is a protruding structure. When the first limiting portion 12 is a protruding structure, the limiting region 121 is a retaining wall at a side, and the guide region 122 is a bevel, an arc surface or a curved surface adjacent or not adjacent to a side of the limiting region 121 so that the second limiting portion 22 may move or slide to the limiting region 121 along the bottom surface of the guide region 122. The second limiting portion 22 may move or slide upward a distance of 0.1 to 200 mm with respect to the limiting member 10 when moving from the guide region 122 to the limiting region 121.

Figure 4:
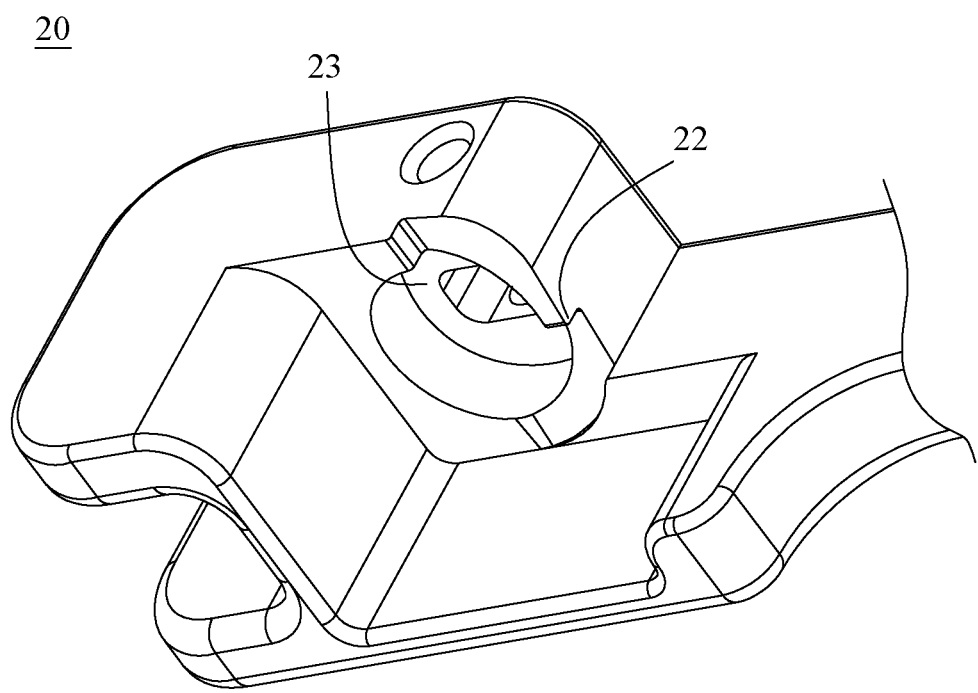
FIG. 4 is a partially enlarged schematic view of the rotating member according to the first embodiment of the present invention.

As shown in FIG. 4, the second limiting portion 22 is a protruding structure for wedging in the limiting region 121 such that the rotating member 20 is temporarily fixed or fixed.

In this embodiment, the first limiting portion 12 may be the same as or different from the second limiting portion 22. For example, the second limiting portion may also have a limiting region and a guide region, which is used to guide the acting direction of the first limiting portion.

In this embodiment, the rotating member and the limiting member are rotatable relative to each other by 5 to 360 degrees or movable up and down a distance in the range of 0.05 to 200 mm. For example, the guide region 122 guides the second limiting portion 22 to drive the rotating member to rotate by 5 to 360 degrees (preferably 15 to 345 degrees) or move a distance in the range of 0.05 to 200 mm.

Figure 5:
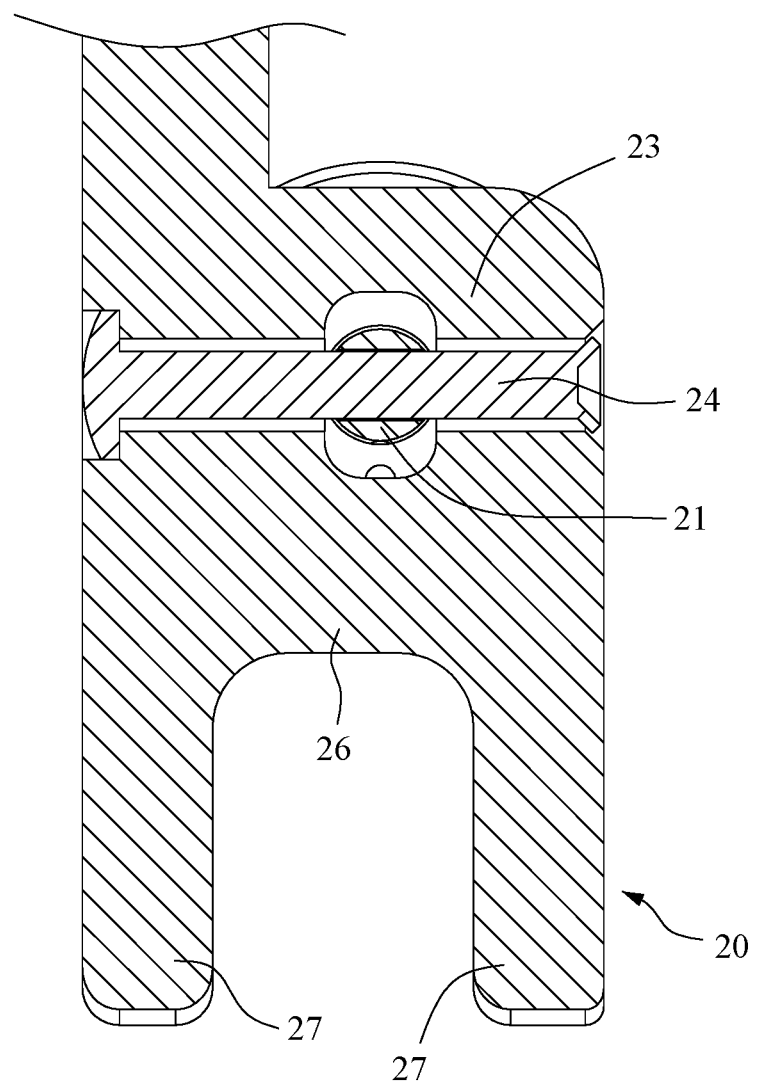
FIG. 5 is another schematic cross-sectional view of the rotary motion structure according to the first embodiment of the present invention.

As shown in FIG. 5, the rotating member 20 includes a head portion 23, which couples with one end of the shaft portion 21. The head portion 23 and the shaft portion 21 are fixed by an engaging piece 24 running therethrough, in which the engaging piece 24 may be a fastener, a cylinder, an elastomer, a buckling body, a flowering body, or a threaded body.

Figure 6:
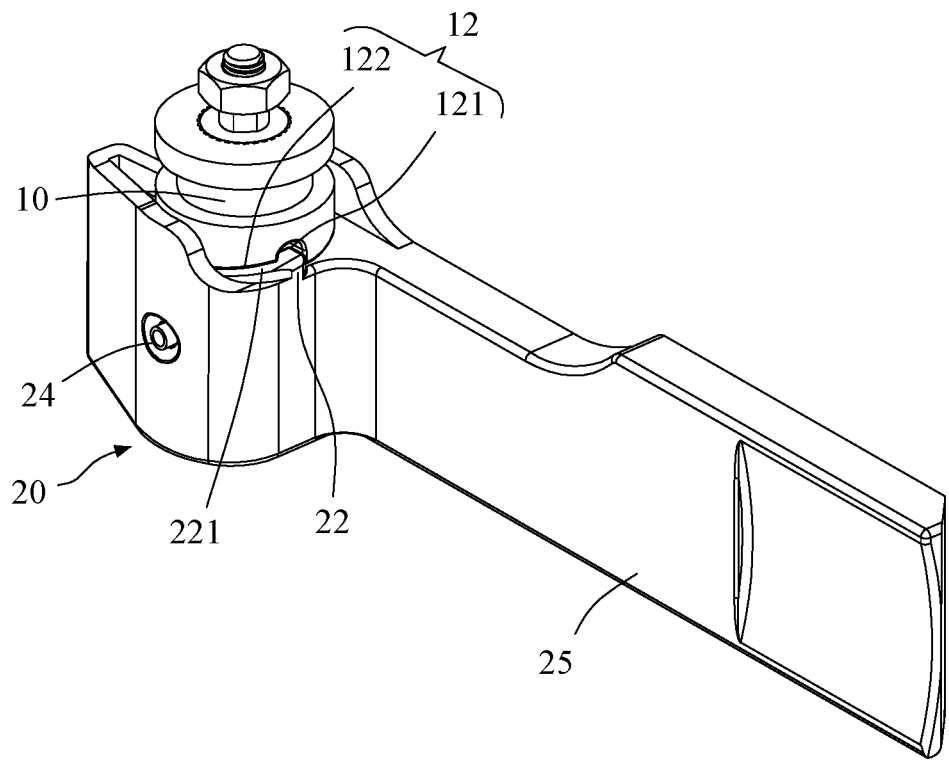
FIG. 6 is a schematic view of the rotary motion structure according to the second embodiment of the present invention.
Figure 7:
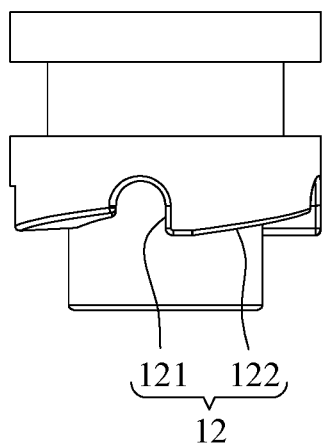
FIG. 7 is a schematic view of the limiting member of the rotary motion structure according to the second embodiment of the present invention.
Figure 8:
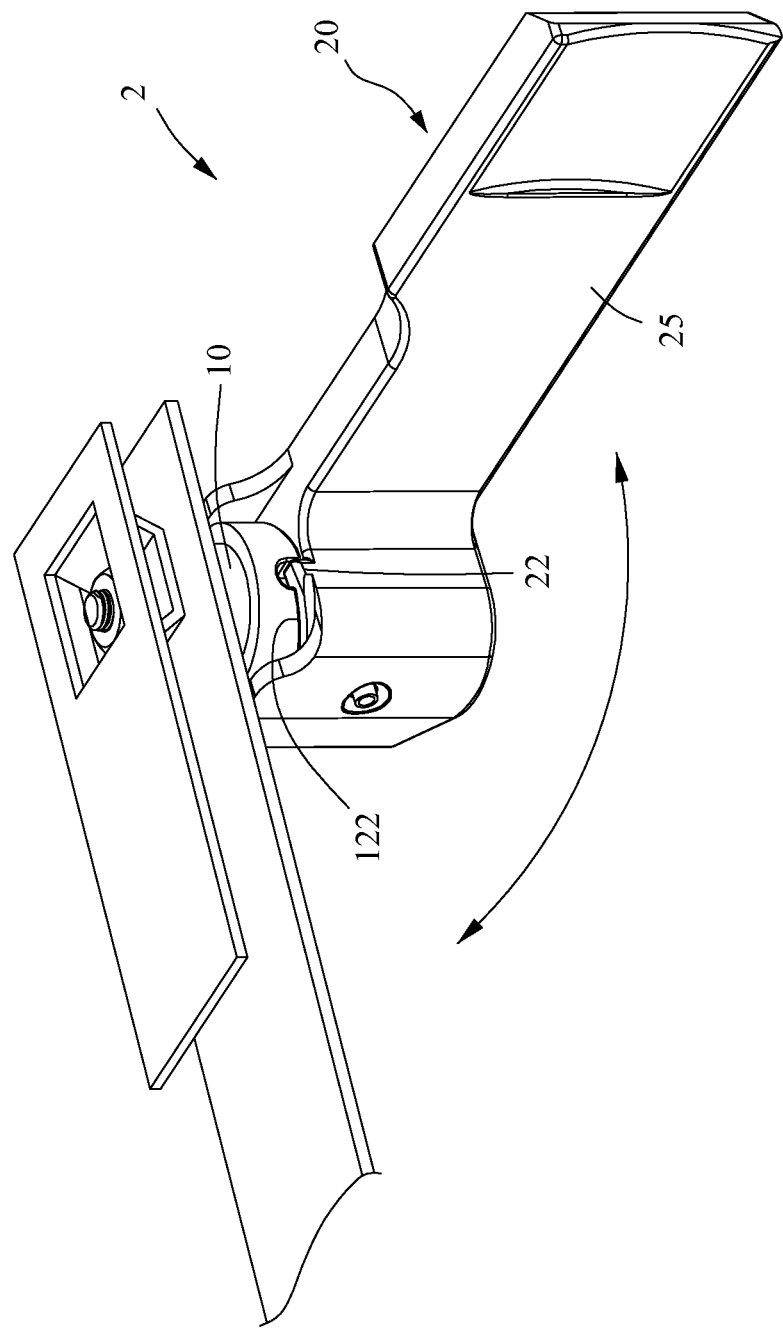
FIG. 8 is a schematic view of the state of use of the rotary motion structure according to the second embodiment of the present invention.

Referring to FIGS. 6 to 8, which are schematic views of the rotary motion structure 2 according to the second embodiment of the present invention.

In this aspect, the first limiting portion 12 may also be a recessed structure; the limiting region 121 is a recessed portion; the guide portion 122 is a recessed portion; and the bottom surface of the guide region 122 is a bevel, an arc surface or a curved surface. In this aspect, the second limiting portion 22 is a protruding structure and formed with a bevel 221.

As shown in FIGS. 6 to 8, the rotary motion structure 2 may limit the rotating member 10 to a closed state by the interference between the first limiting portion 12 and the second limiting portion 22. When it is desired to open the rotating member 20, the rotating member 20 is pushed down by an applied force such that the first limiting portion 12 is displaced from the second limiting portion 22 without interfering with each other. As the first limiting portion 12 and the second limiting portion 22 do not interfere with each other, the rotating member 10 can be rotated relative to the limiting member 10 by the elastic force of the elastic member (not shown), thereby exhibiting an open state.

Figure 9:
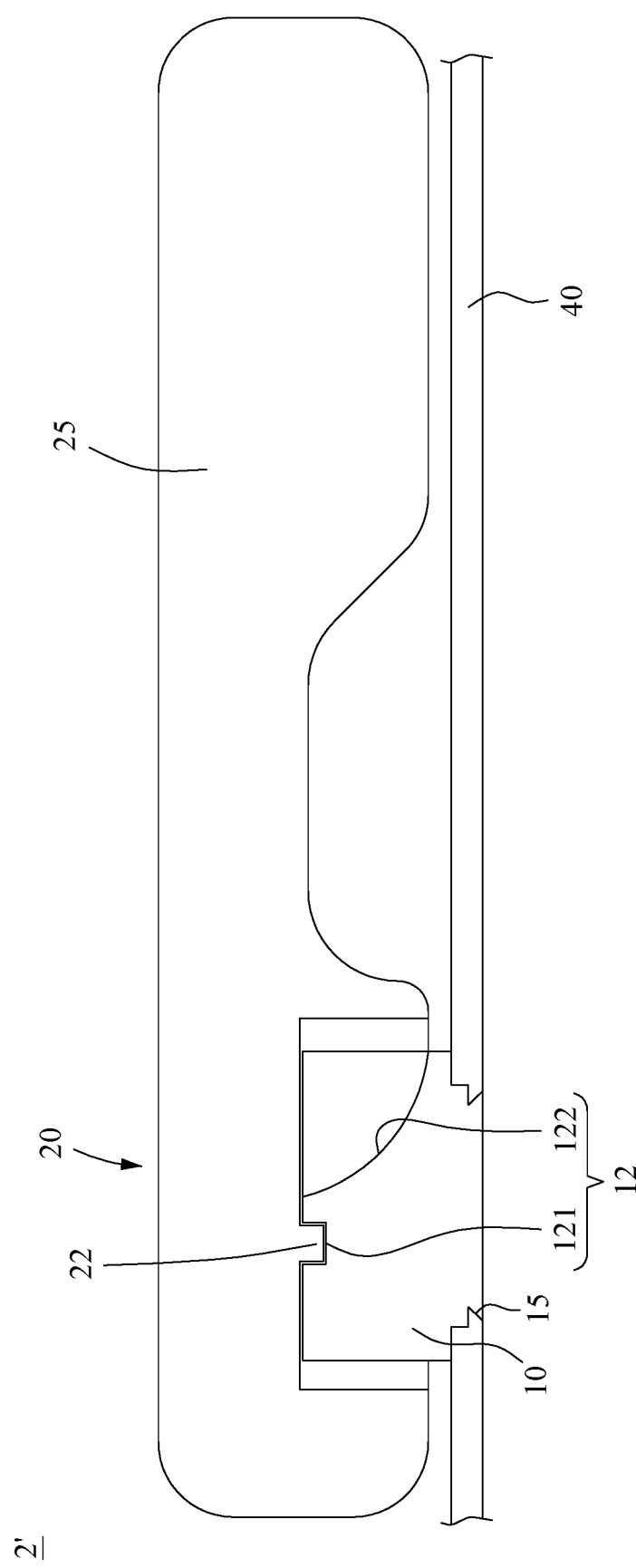
FIG. 9 is a schematic view of another aspect of the rotary motion structure according to the second embodiment of the present invention.

Referring to FIG. 9, which is a schematic view of the rotary motion structure 2' of another aspect according to the second embodiment of the present invention.

Figure 10:
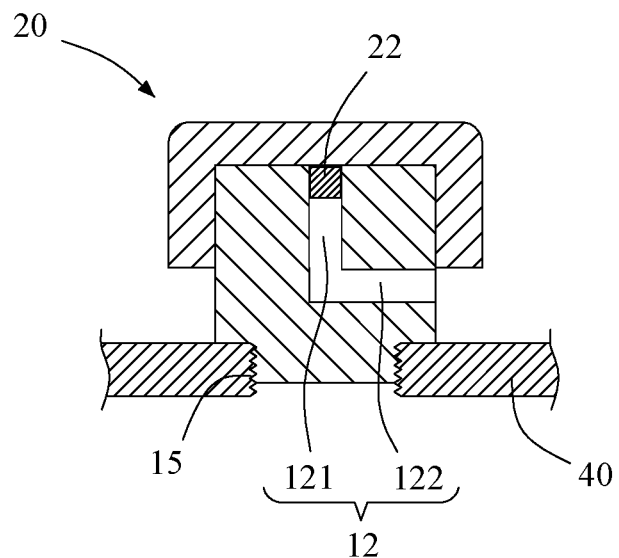
FIG. 10 is a schematic view of the rotary motion structure according to the third embodiment of the present invention.
Figure 11:
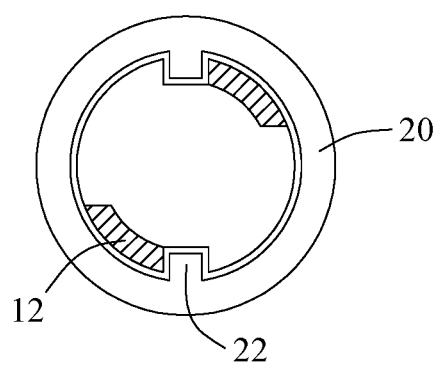
FIG. 11 is a schematic view of the first limiting portion and the second limiting portion in FIG. 7.

In this embodiment, the first limiting portion 12 may also be a recessed structure; the limiting region 121 is a recessed portion; the guide region 122 is a recessed portion; and the bottom surface of the guide region 122 is a bevel, an arc surface or a curved surface. In this aspect, the second limiting portion 22 is a protruding structure, and the second limiting portion 22 can move or slide into the limiting region 121 along the bottom surface of the guide region 122. Similarly, the first limiting portion 12 and the second limiting portion 22 in this embodiment may be the same or different. Referring to FIGS. 10 and 11, which are schematic views of the rotary motion structure according to the third embodiment of the present invention.

In this embodiment, the first limiting portion 12 is also a recessed structure; the limiting region 121 is a recessed portion extending vertically; and the guide region 122 is a recessed portion extending horizontally. For example, the limiting region 121 and the guide region 122 may form an L-shape, a T-shape, a bevel shape, a curved surface shape, or an arc surface shape, etc. In addition, the limiting region 121 can communicate or not communicate with the guide region 122. Similarly, the first limiting portion 12 and the second limiting portion 22 of this embodiment may be the same or different.

In this embodiment, the limiting member 10 may be provided with an engaging portion 15 for coupling to a first object 40, which is, for example, a board, a circuit board or other objects. In the implementation, the rotary motion structure 1 of an embodiment of the present invention can be combined with the first object 40 by the engaging portion 15 to form a module. The engaging portion 15 may engage with the first object 40 by riveting, expanding, locking, welding, bonding, or buckling, or the engaging portion 15 is integrally formed with the first object 40, thereby allowing the subsequent assembling process to be faster and more convenient.

In this embodiment, the rotating member 20 may include an operating portion 25, which is connected to the head portion 23 for handheld operation of the rotating member 20. Also, the rotating member 20 includes an acting portion 26, which is connected to the head portion 23. As shown, the acting portion 26 is connected to one side of the head portion 23 opposite the operating portion 25. The operating portion 25, the acting portion 26, and the shaft portion 21 may be formed integrally, or may be assembled by riveting, expanding, locking, welding, buckling, bonding, thermal melting or plastic buried injection. In addition, the operating portion 25 is integrally formed with, movably engaged with or fixedly engaged with the rotating member 20 or the head portion 23, in which the operating portion 25 is movably engaged with or fixedly engaged with the rotating member 20 or the head portion 23 by buckling, interfering, crossing, lodging, an intervening article, riveting, expanding, locking, or inserting.

The operating portion 25 may have a pressing portion 251 formed with a protrusion, a recess, a bevel, an arc surface, a curved surface, a step, a groove, a recessed hole, or a through hole.

The rotating member 20 includes an abutting portion 27, which is connected to the acting portion 26 and has a protrusion, a recess, a bevel, an arc surface, a curved surface, a step, a groove, a recessed hole, a through hole, a cylinder or a sheet. The abutting portion 27 is adapted to abut against and then drive or engage with other objects to move while the rotating member 20 is rotating.

Figure 12:
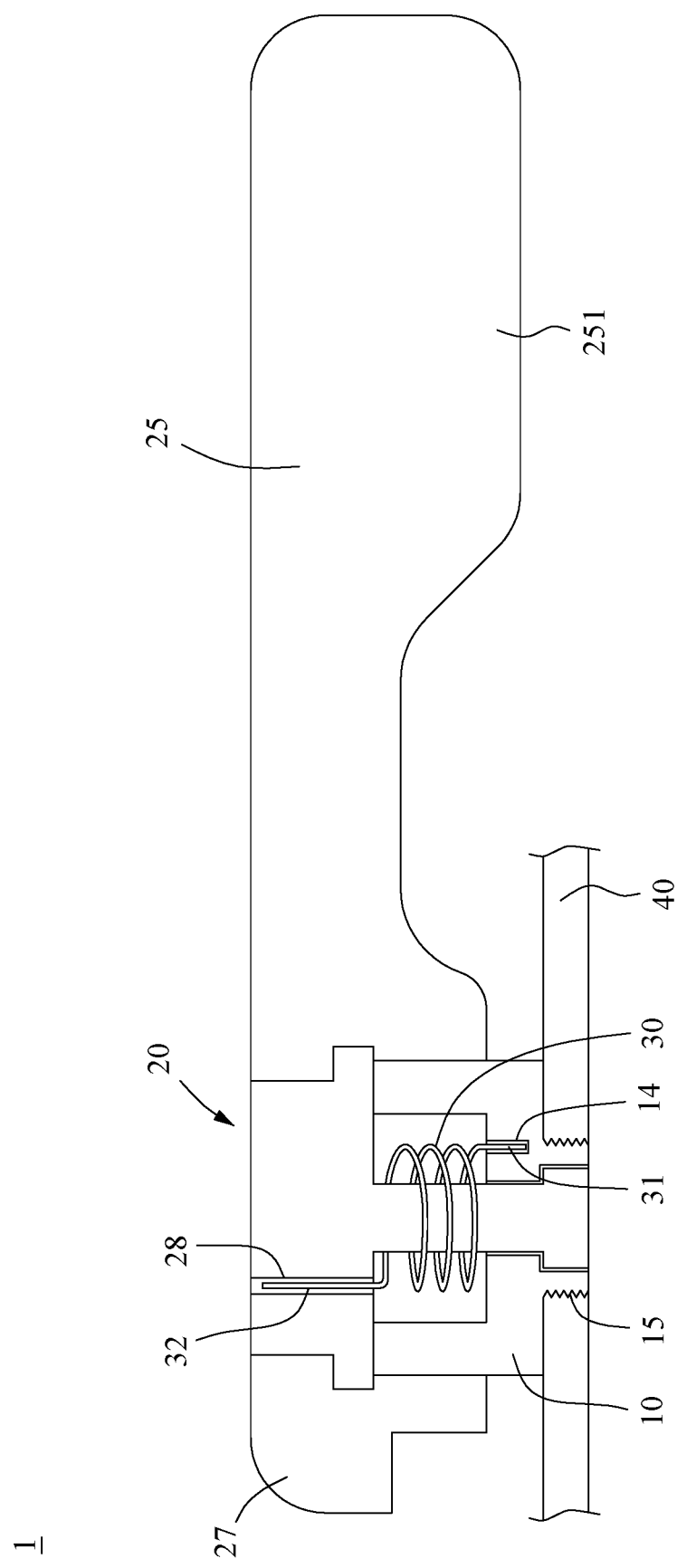
FIG. 12 is a schematic view of the rotary motion structure according to the fourth embodiment of the present invention.

As shown in FIG. 12, which is a schematic view of the rotary motion structure according to the fourth embodiment of the present invention. The elastic member 30 exemplified in this embodiment is a torsion spring having two bent ends 31, 32. The limiting member 10 includes a first abutting portion 14. The rotating member 20 includes a second abutting portion 28. Two bent ends 31, 32 of the elastic member 30 are coupled with the first abutting portion 14 and the second abutting portion 28, respectively. The first abutting portion 14 may be a recessed hole, a recess, a protrusion, or a stepped structure, and the second abutting portion 28 may be a recessed hole, a recess, a protrusion, or a stepped structure.

Figure 13A:
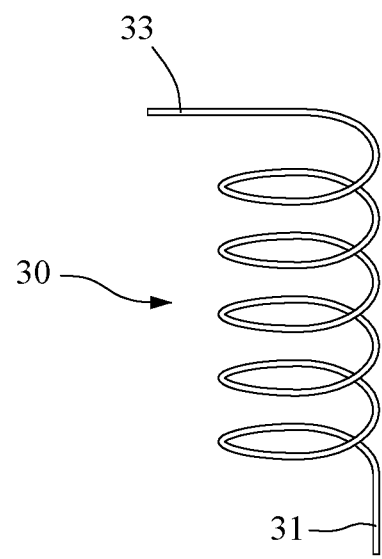
FIGS. 13A-13B are schematic views of the elastic member and related disposition thereof in the present invention.
Figure 13B:
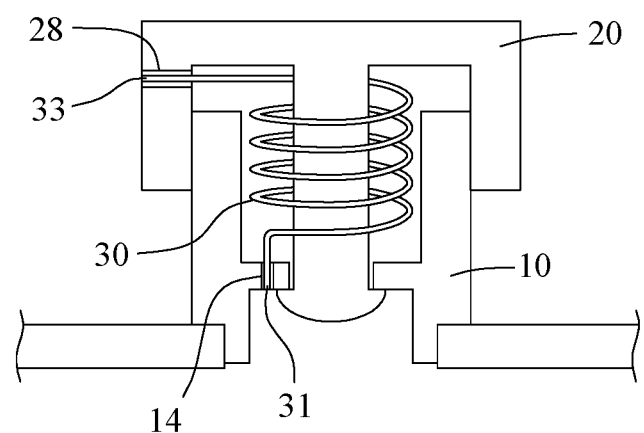
Figure 14A:
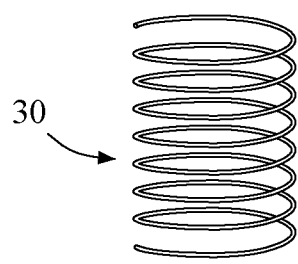
FIGS. 14A-14E are schematic views of other aspects of the elastic member of the present invention.
Figure 14B:
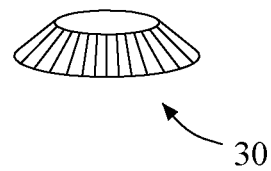
Figure 14C:
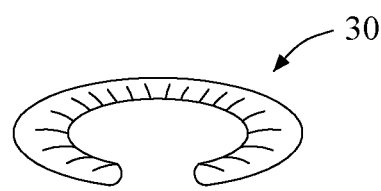
Figure 14D:
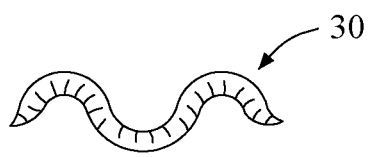
Figure 14E:
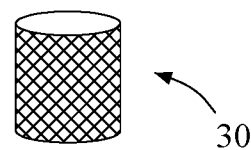
Figure 15A:
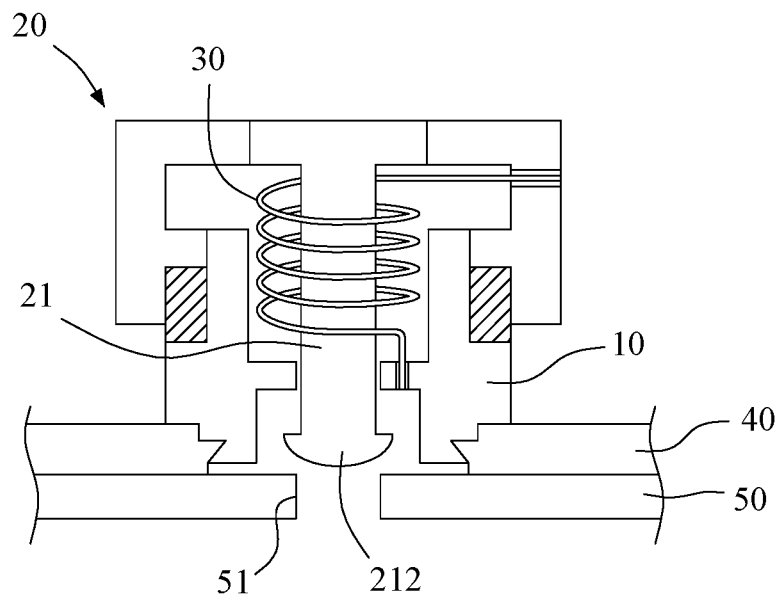
FIGS. 15A-15D are schematic views of the rotary motion structure having an engaging piece according to the fifth embodiment of the present invention.
Figure 15B:
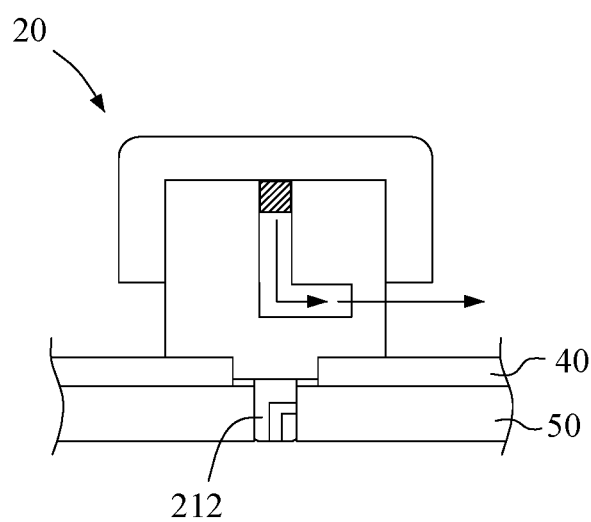
Figure 15C:
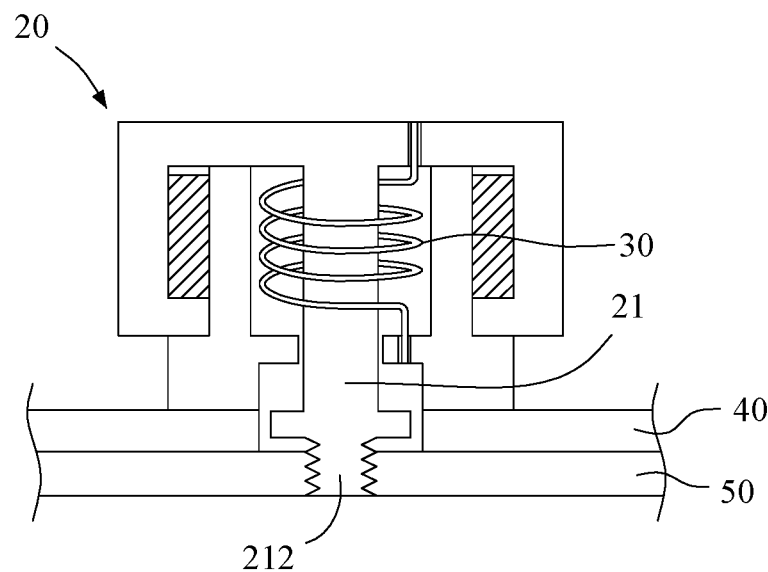
Figure 15D:
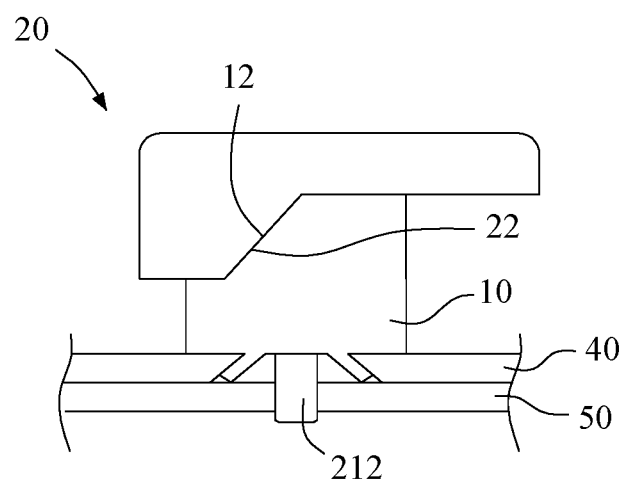

However, the manner in which the elastic member 30 is coupled with the limiting member 10 and the rotating member 20 is not limited to this. As shown in FIGS. 13A and 13B, the elastic member 30 may have only one bent end 31, which is coupled with the first abutting portion 14 of the limiting member 10, and the other end of the elastic member 30 is a straight end 33, which is coupled with the second abutting portion 28 of the rotating member 20.

In addition, as shown in FIGS. 14A-14E, the elastic member 30 may also be a coil spring, a disc-type shrapnel, a C-type shrapnel, a wave-type shrapnel, or an elastic cylinder.

Referring to FIGS. 15A-15D, which are schematic views of the rotary motion structure according to the fifth embodiment of the present invention. In this embodiment, the shaft portion 21 is provided with a fastening portion 212 for fastening a second object 50 having a pre-provided fastening hole 51. As shown in FIGS. 15A-15D, the fastening portion 212 may be a protruding fastener, a recessed fastener, a cylinder, a threaded body or a cylinder.

Figure 16:
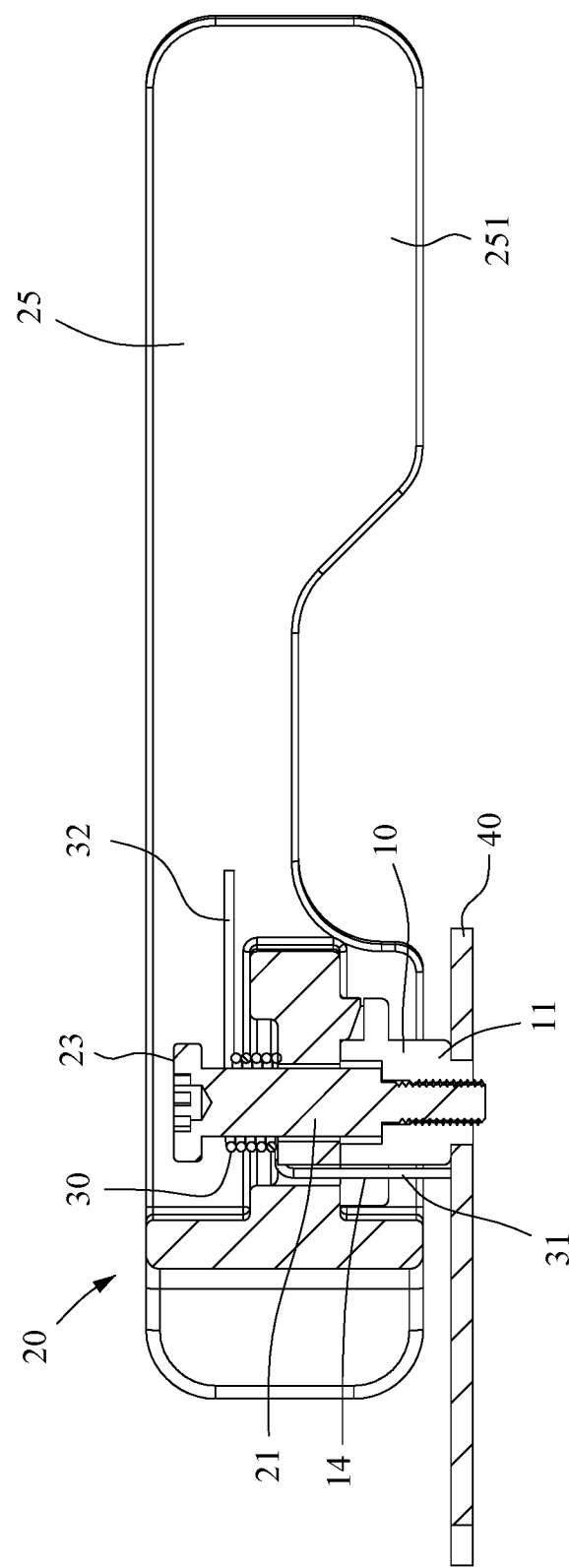
FIG. 16 is a schematic view of the rotary motion structure according to the sixth embodiment of the present invention.

Referring to FIG. 16, which is a schematic view of the rotary motion structure according to the sixth embodiment of the present invention. In this embodiment, the head portion 23 of the rotating member 20 is rotatably sleeved on the shaft portion 21, which is provided on the limiting member 10. As shown, the bent end 31 of the elastic member 30 is coupled with the first abutting portion 14 of the limiting member 10, and the straight end 33 of the elastic member 30 abuts on the operating portion 25 or the acting portion 26.

Figure 17:
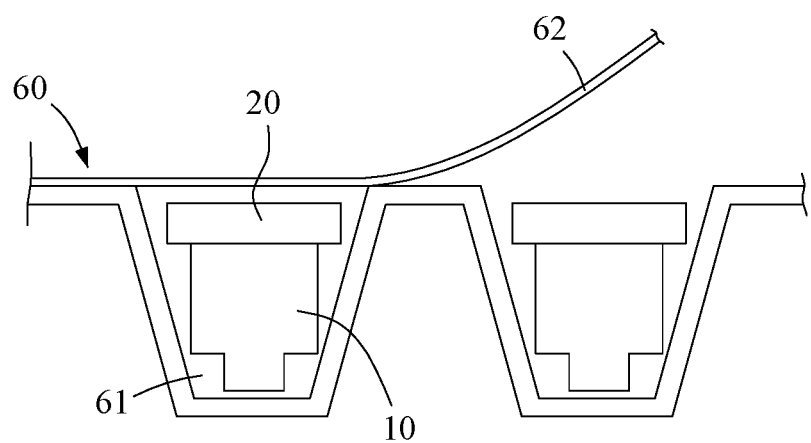
FIG. 17 is schematic view of the rotary motion structure having a storage member of the present invention.

Referring to FIG. 17, in this embodiment, the rotary motion structure 1 may further comprise a storage member 60 having a receiving area 61, where the limiting member 10 and the rotating member 20 are located. The storage member 60 may be a material disc or belt. Besides, the storage member 60 may further have a cover 62 for sealing the receiving area 61.

Figure 18:
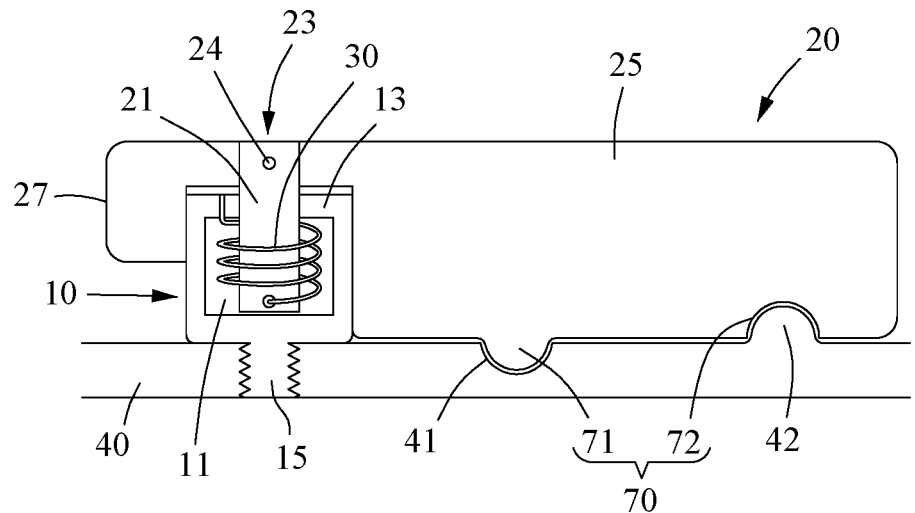
FIG. 18 is a schematic view I of the rotary motion structure according to the seventh embodiment of the present invention.
Figure 19:
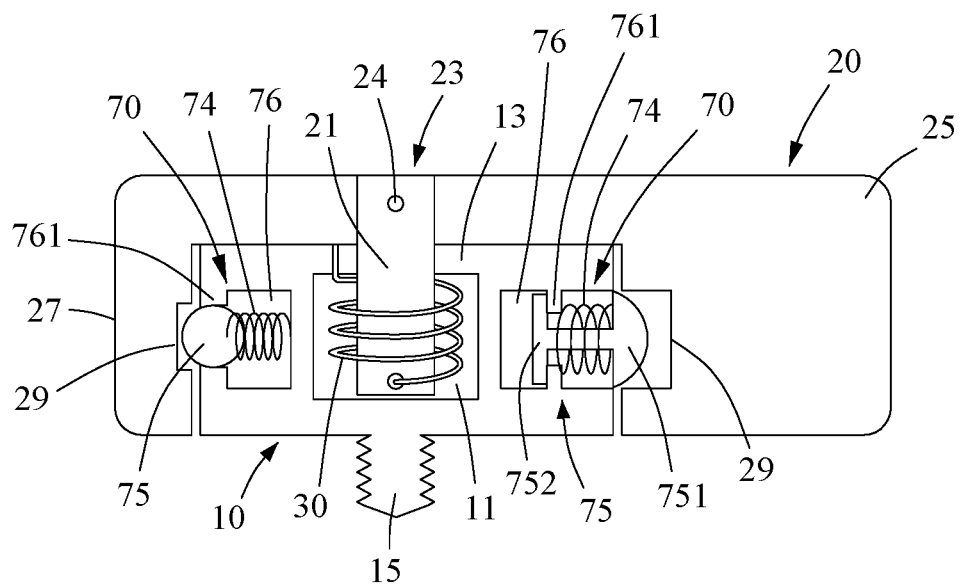
FIG. 19 is a schematic view II of the rotary motion structure according to the seventh embodiment of the present invention.
Figure 20:
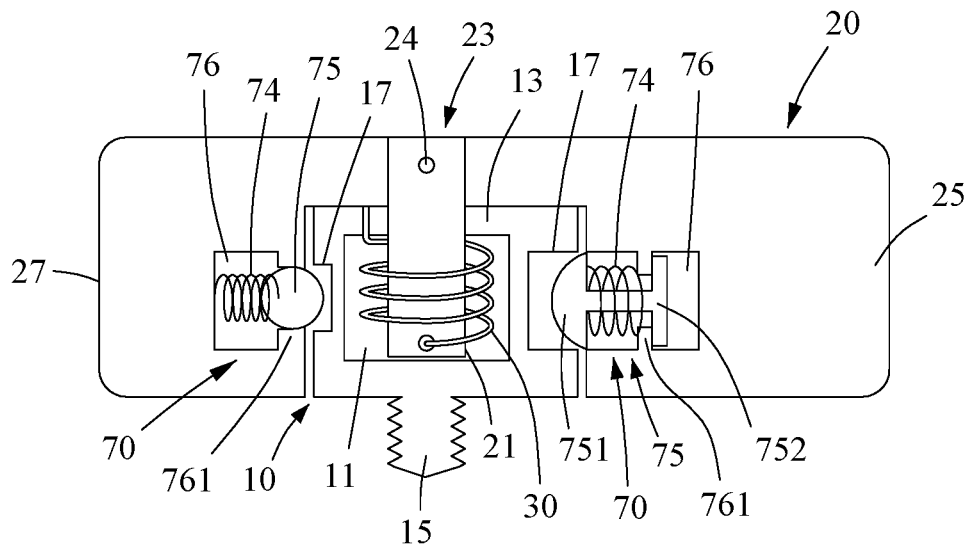
FIG. 20 is a schematic view III of the rotary motion structure according to the seventh embodiment of the present invention.
Figure 21:
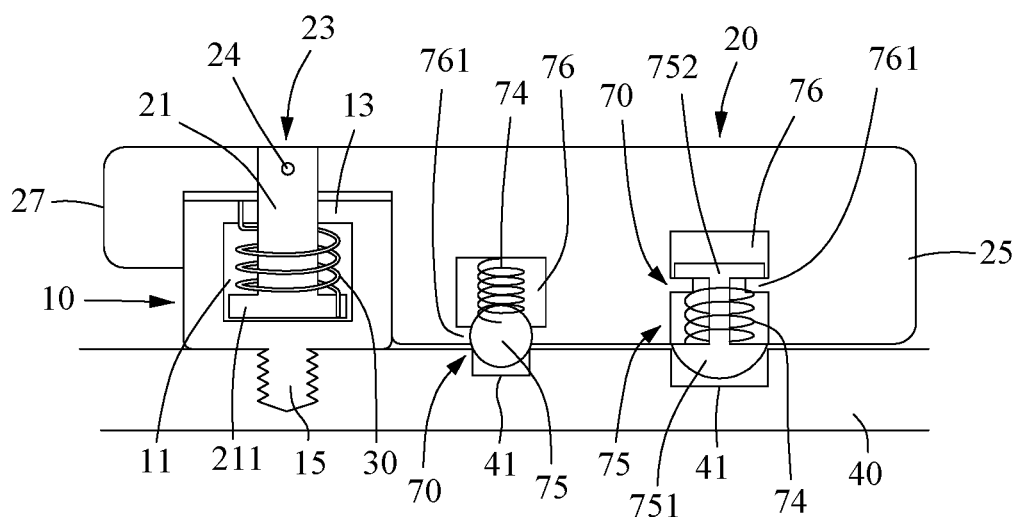
FIG. 21 is a schematic view IV of the rotary motion structure according to the seventh embodiment of the present invention.
Figure 22:
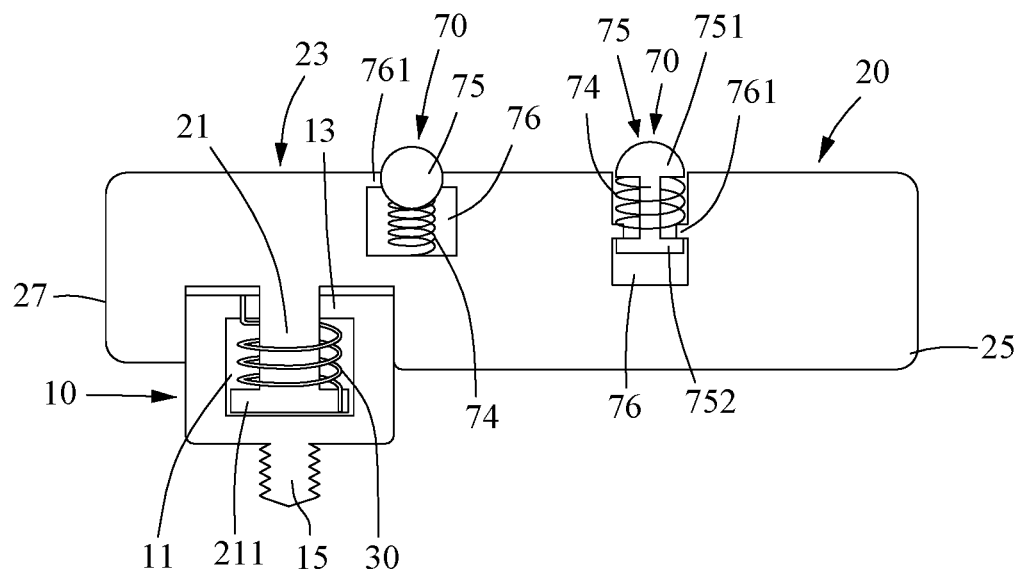
FIG. 22 is a schematic view V of the rotary motion structure according to the seventh embodiment of the present invention.

Referring to FIGS. 18 to 22, in this embodiment, the rotary motion structure 1 may further comprise at least a positioning portion 70, which may be provided at the limiting member 10 or the rotating member 20 to position the rotating member 20. As shown in FIGS. 18 and 21, the positioning portion 70 may be provided at the bottom of the rotating member 20 so that the rotating member 20 is positioned on a first object 40. As shown in FIG. 19, the positioning portion 70 may be provided at the side of the limiting member 10 so that the rotating member 20 is positioned at the limiting member 10. As shown in FIG. 20, the positioning portion 70 may be provided in the head portion 23 of the rotating member 20 so that the rotating member 20 is positioned at the limiting member 10. As shown in FIG. 22, the positioning member 70 may be provided at the top of the rotating member 20 so that the rotating member 20 is positioned at other objects.

Referring to FIG. 18, in this embodiment, the positioning portion 70 may be a positioning protrusion 71 or a positioning recess 72 to be positioned at a corresponding positioning recess 41 or a corresponding positioning protrusion 42 of the first object 40.

Referring to FIGS. 19 to 22, in this embodiment, the positioning portion 70 may have a positioning piece 75, a positioning elastic piece 74, and a limiting groove 76. The positioning piece 75 and the positioning elastic piece 74 are confined to the limiting groove 76, and the positioning piece 75 is confined to the limiting flange 761 inside the limiting groove 76. The positioning elastic piece 74 abuts between the limiting groove 76 (the limiting flange 761) and the positioning piece 75 so that a portion of the positioning piece 75 is exposed outside of the limiting groove 76 to position the rotating member 20. As shown in FIG. 19, the positioning portion 70 may be provided at the side portion of the limiting member 10 so that a portion of the positioning piece 75 is placed into the corresponding positioning recess 29 of the rotating member 20 to further position the rotary member 20. As shown in FIG. 20, the positioning portion 70 may be provided in the head portion 23 of the rotating member 20 so that a portion of the positioning piece 75 is placed into the corresponding positioning recess 17 of the limiting member 10 to further position the rotary member 20. As shown in FIG. 21, the positioning portion 70 may be provided at the bottom of the rotating member 20 so that a portion of the positioning piece 75 is placed into the corresponding positioning recess 41 of the first object 40 to further position the rotary member 20. As shown in FIG. 22, the positioning portion 70 may be provided at the top of the rotating member 20 so that a portion of the positioning piece 75 is placed into the corresponding positioning recess of other objects to further position the rotary member 20.

Figure 23:
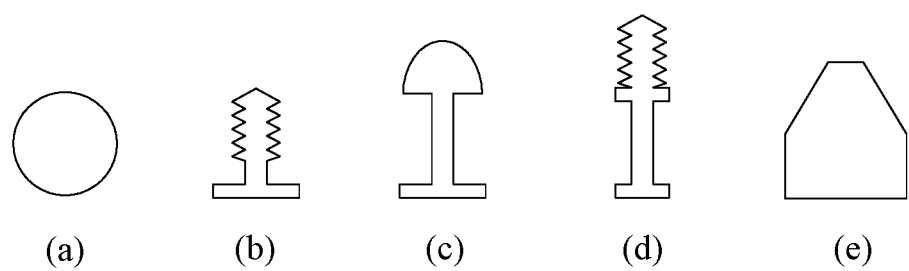
FIG. 23 is a schematic view of the positioning piece of the rotary motion structure according to the seventh embodiment of the present invention.
Figure 24:
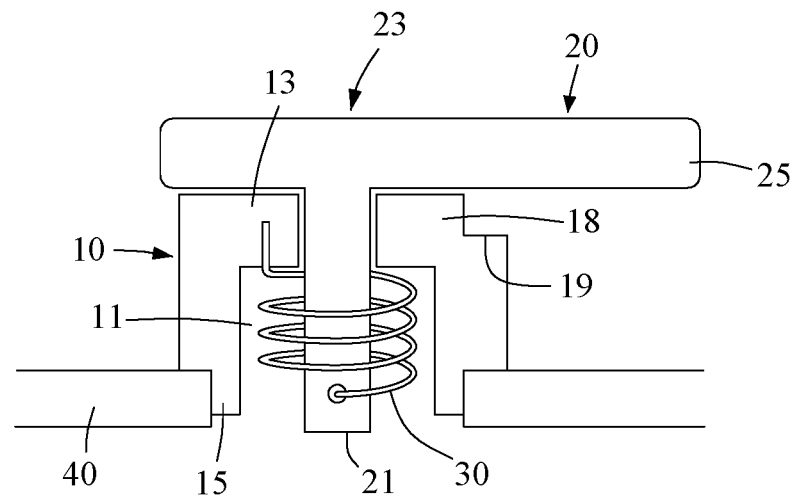
FIG. 24 is a schematic view I of the rotary motion structure according to the eighth embodiment of the present invention.
Figure 25:
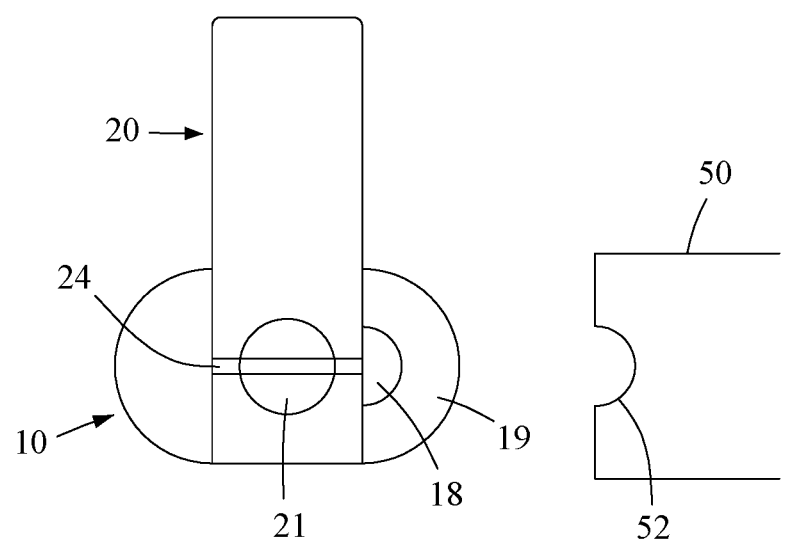
FIG. 25 is a schematic view II of the rotary motion structure according to the eighth embodiment of the present invention.
Figure 26:
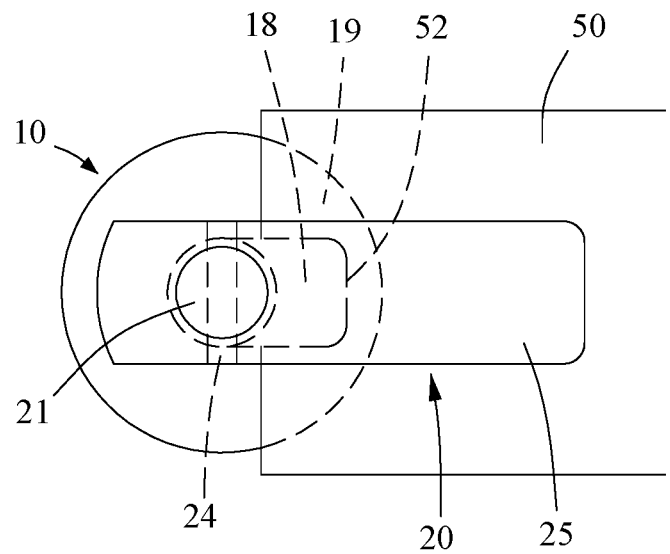
FIG. 26 is a schematic view III of the rotary motion structure according to the eighth embodiment of the present invention.
Figure 27:
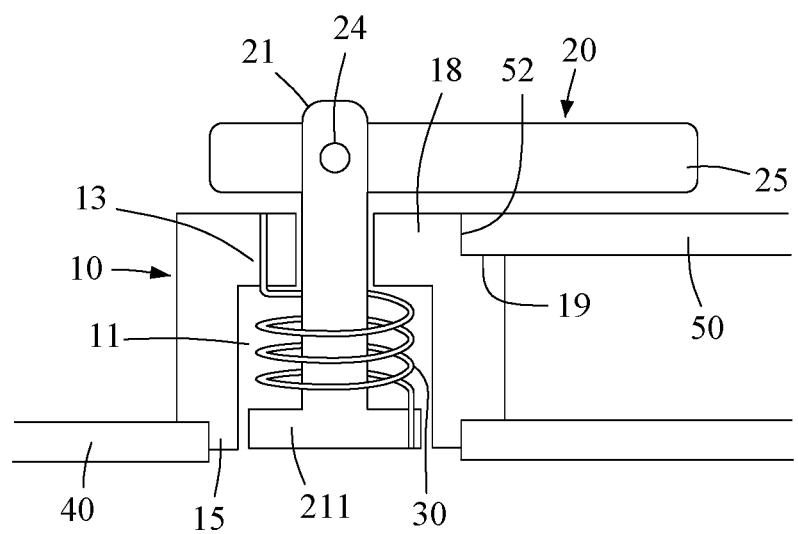
FIG. 27 is a schematic view IV of the rotary motion structure according to the eighth embodiment of the present invention.

Referring to FIG. 23, in this embodiment, the positioning piece 75 may be a sphere (as shown in FIG. 23(*a*)), a threaded body (as shown in FIG. 23(*b*)) or a cone (as shown in FIG. 23(*e*)) (or a cylinder, a curved surface, an inner fastener or an outer fastener). Furthermore, referring to FIGS. 19 to 22, in this embodiment, the positioning piece 75 may have a positioning protrusion 751 and a limiting body 752 that connect to each other (as shown in FIG. 23(*c*)). The positioning elastic piece 74 is sleeved at the connection between the positioning protrusion 751 and the limiting body 752, which abuts against the limiting flange 761 inside the limiting groove 76. The positioning elastic piece 74 abuts between the limiting flange 761 inside the limiting groove 76 and the positioning protrusion 751 so that a portion of the positioning protrusion 751 is exposed outside of the limiting groove 76 for positioning the rotating member 20. Further, referring to FIG. 23(*d*), in this embodiment, the positioning protrusion 751 may be a threaded body.

Referring to FIGS. 24 to 27, in the present embodiment, there may be an interference positioning portion 18 on the top of the limiting member 10 for positioning a second object 50 between the rotating member 20 and the limiting member 10 by interference. In addition, the interference positioning portion 18 may be a protrusion (or a recess) for positioning the corresponding interference positioning recess 52 (or the corresponding interference positioning protrusion) of the second object 50 by interference. Further, there may be a shoulder 19 adjacent to the interference positioning portion 18 on the top of the limiting member 10 for supporting the second object 50.

Accordingly, the rotary motion structure 1 of the present embodiment is preferably a handle device having a positioning function, in which the rotating member 20 may be rotated relative to the limiting member 10 by means of the elastic member 30 so that the rotating member 20 can have a positioning effect of automatic positioning, frictional positioning, temporary positioning or fixed positioning.

Figure 28:
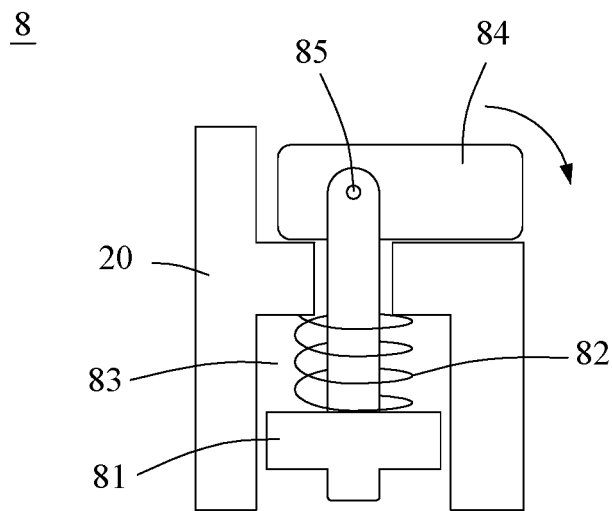
FIGS. 28-29 are schematic views of the positioning piece of the rotary motion structure according to the ninth embodiment of the present invention.
Figure 29:
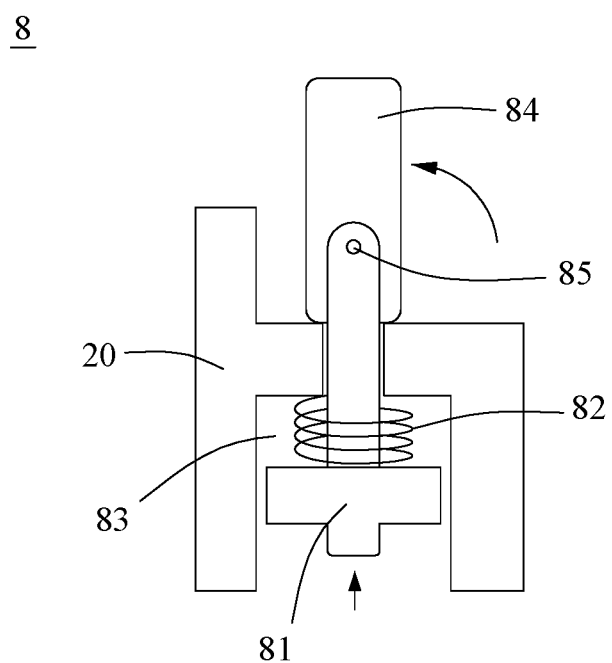

Referring to FIGS. 28 and 29, which are schematic views of a positioning piece of the rotary motion structure according to the ninth embodiment of the present invention. In this embodiment, the positioning portion 8 comprises at least a positioning piece 81, an elastic piece 82, a limiting groove 83, and a control portion 84, in which one end of the elastic piece 82 abuts against the rotating member 20, and the other end of the elastic piece 82 abuts against the positioning piece 81. Also, the control portion 84 is detachably combined with the positioning piece 81 to abut against the rotating member 20, so that the control portion 84 actively drives the positioning piece 81 and the opening and closing of the first object. The positioning piece 81 and the control portion 84 are combined with the engaging piece 85, which is a plug, a cylinder or a fastener integrally formed with the control portion 84 or the positioning piece 81.

Figure 30:
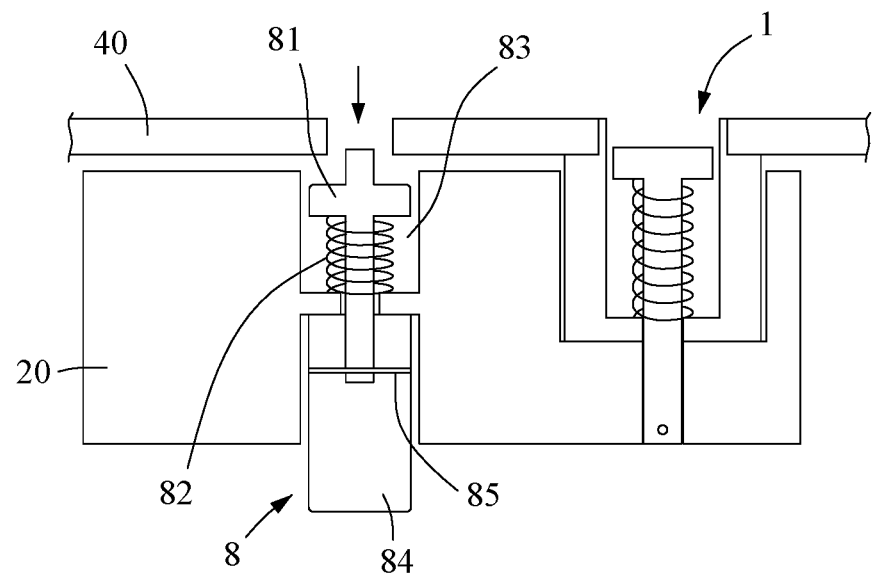
FIGS. 30-31 are schematic views of the rotary motion structure according to the tenth embodiment of the present invention.
Figure 31:
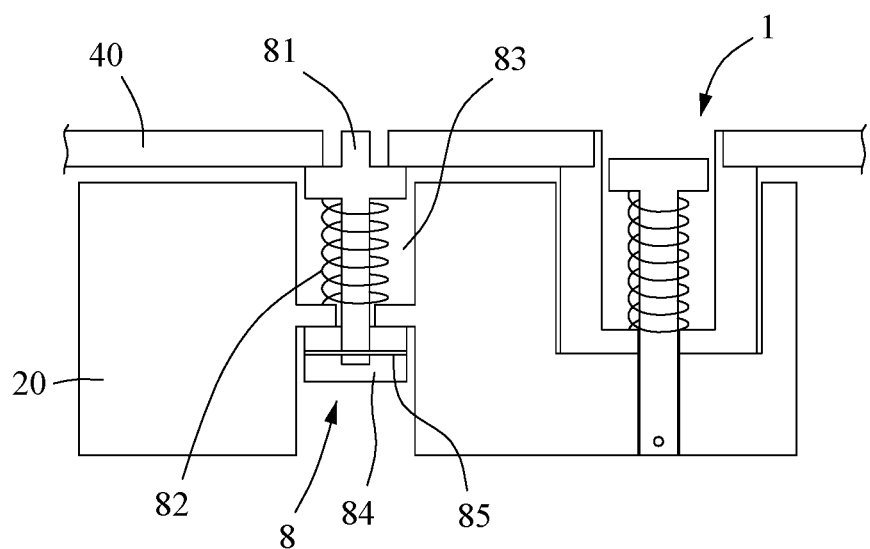

Referring to FIGS. 30 and 31, which are schematic views of the rotary motion structure according to the tenth embodiment of the present invention. In this embodiment, the positioning portion 8 (as shown in FIGS. 28 and 29) of the ninth embodiment described above is provided at the rotating member 20 and disposed at one side of the rotary motion structure 1 so that the positioning piece 81 of the positioning portion 8 can be positioned at a first object 40, in addition to the operational use of the rotary motion structure 1 described in the foregoing embodiments. When it is desired for the positioning portion 8 to release the first object 40, a force is applied to the control portion 84, which then abuts against the rotating member 20 and engages the engaging piece 85 to pull the positioning piece 81 in a direction such that the positioning piece 81 is released from the first object 40 and the elastic piece 82 is pressed to form an open state with the first object 40 (as shown in FIG. 30). When it is desired to fix the first object 40 by the positioning portion 8, the control portion 84 is pulled in an opposite direction such that the control portion 84 abuts against the rotating member 20 and engages the engaging piece 85 to push the positioning piece 81, and then the elastic piece 82, exhibiting a recovering state, abuts and pushes the positioning piece 81 with the assistance of its recovering elastic force to combine the positioning piece 81 with the first object 40, thereby exhibiting a closed state. (as shown in FIG. 31).

Figure 32:
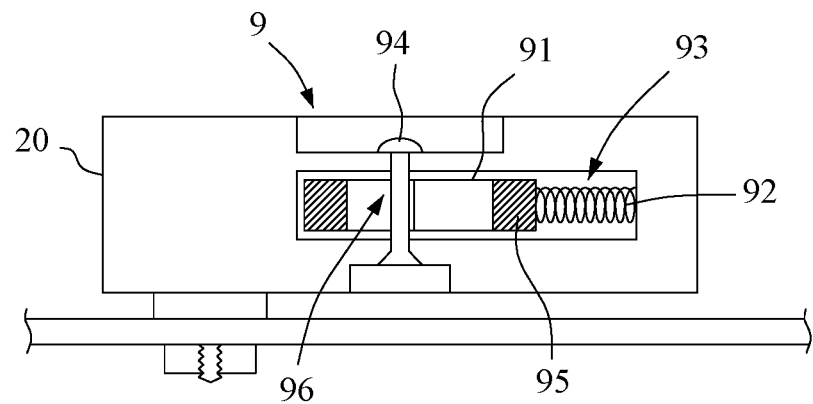
FIG. 32 is a schematic view of the rotary motion structure according to the eleventh embodiment of the present invention.
Figure 33:
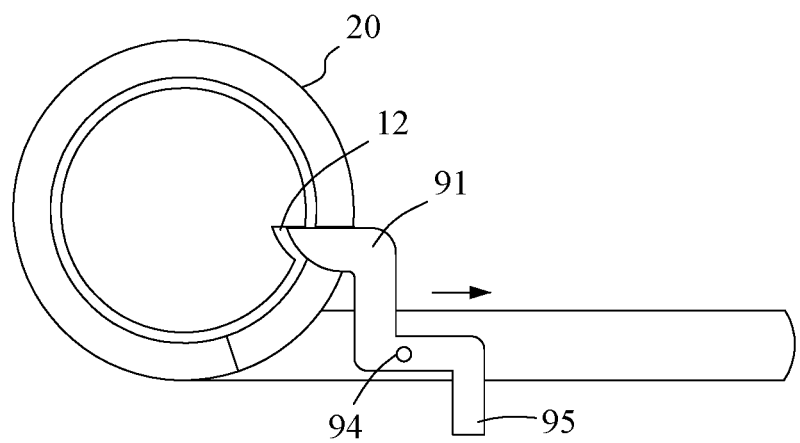
FIGS. 33-35 are schematic views of the state of use of the eleventh embodiment of the present invention.
Figure 34:
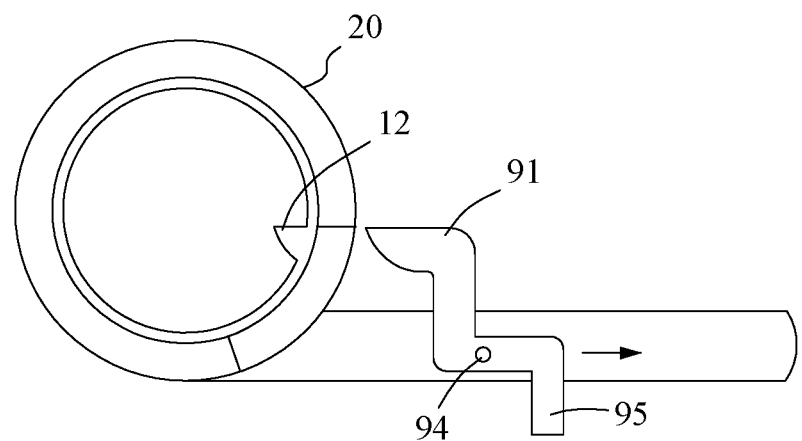
Figure 35:
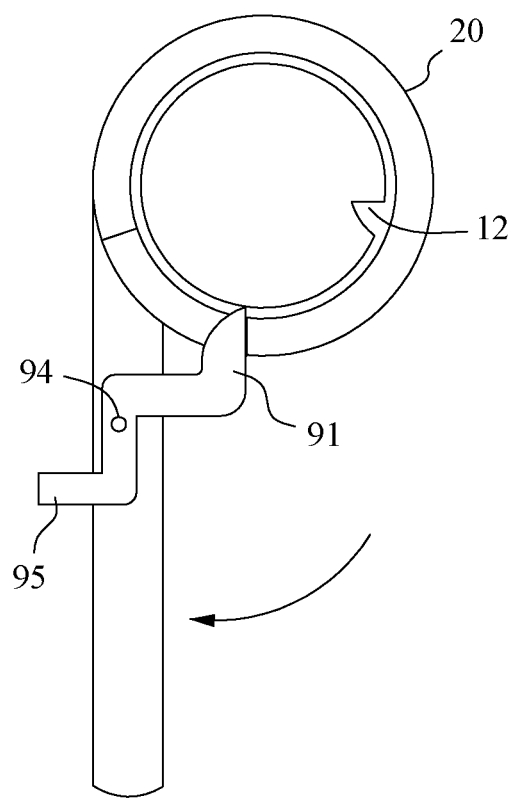

Referring to FIGS. 32-34, which are schematic views of the rotary motion structure according to the eleventh embodiment of the present invention and the state of use of the eleventh embodiment of the present invention. In this embodiment, the positioning portion 9 has a positioning piece 91, a positioning elastic piece 92, a limiting groove 93, and a limiting body 94. The positioning piece 91 and the positioning elastic piece 92 are limited to the limiting groove 93 for their location. The positioning elastic piece 92 abuts against the positioning piece 91. A portion of the positioning piece 91 is exposed outside the limiting groove 93 for positioning the rotating member 20. The limiting body 94 is assembled simultaneously at the rotating member 20 and the positioning piece 91, which has a control portion 95 exposed outside the limiting groove 93 for operating the positioning piece 91. Also, the positioning piece 91 has an action space 96 for the action of the positioning piece 91. The limiting body 94 is a cylinder, a rod, or a fastener. The positioning piece 91 is movably positioned at the first limiting portion 12 or the positioning recess (not shown) of the rotating member 20 for the positioning piece 91 to move.

Figure 36:
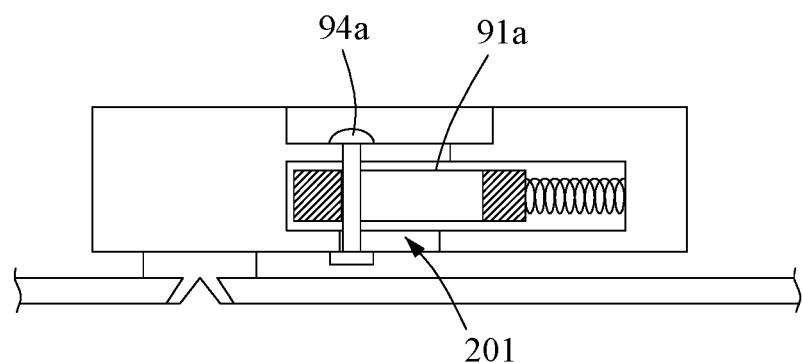
FIG. 36 is a schematic view of the rotary motion structure according to the twelfth embodiment of the present invention.
Figure 37:
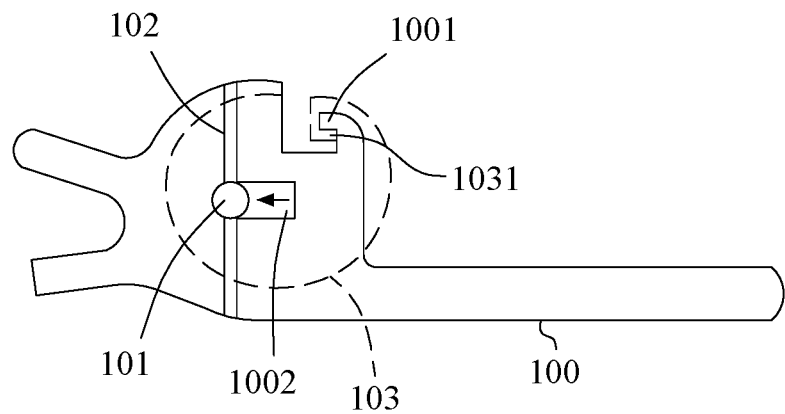
FIGS. 37-41 are schematic views of the thirteenth embodiment of the present invention.
Figure 38:
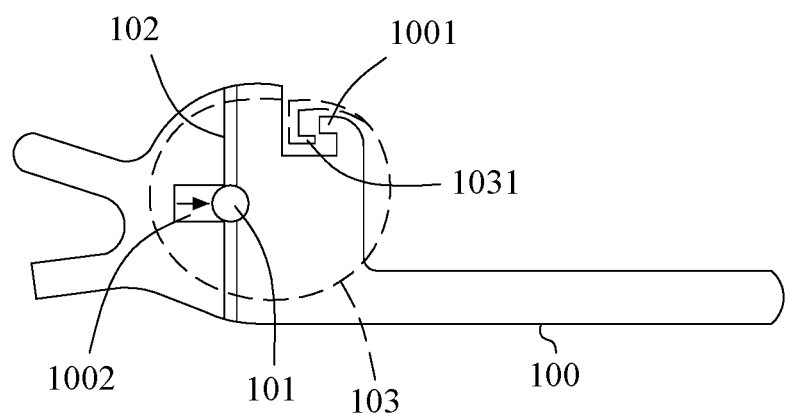
Figure 39:
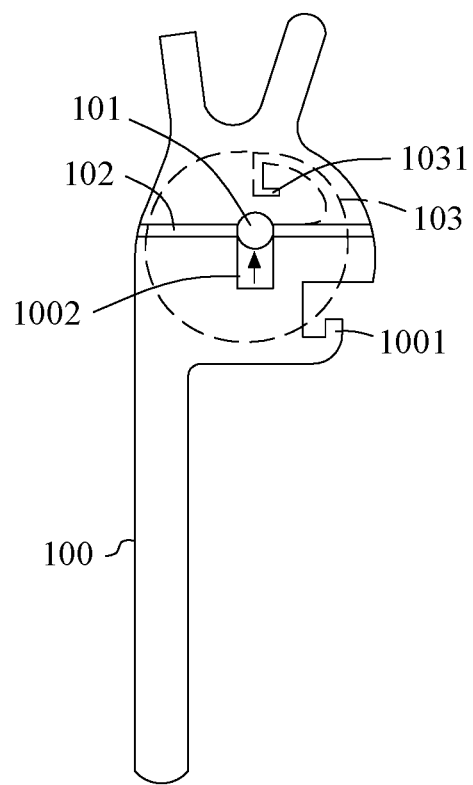
Figure 40:
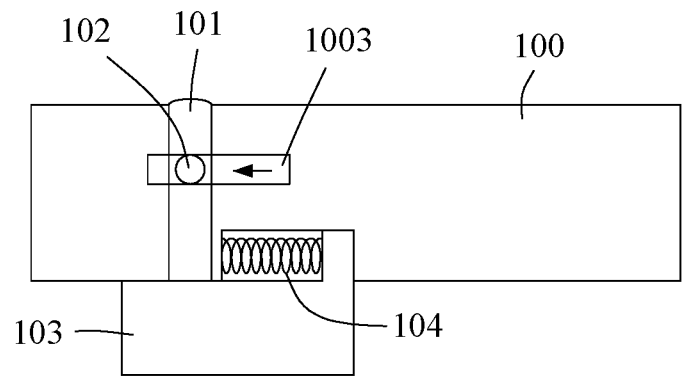
Figure 41:
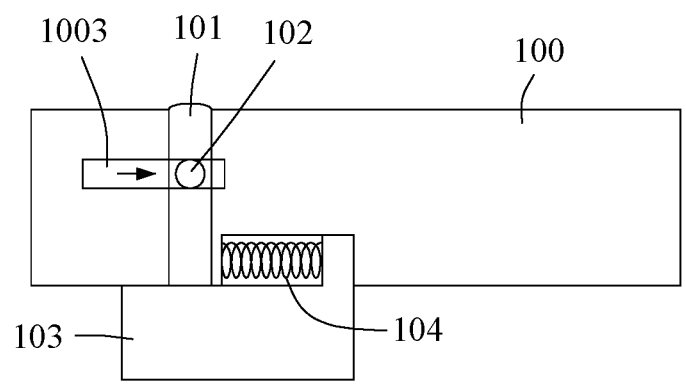
Figure 42:
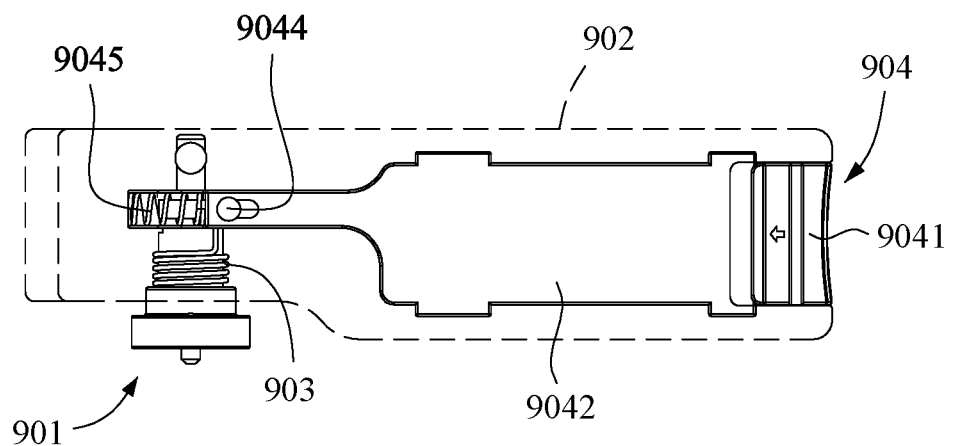
FIGS. 42-45 are schematic views of the fourteenth embodiment of the present invention.
Figure 43:
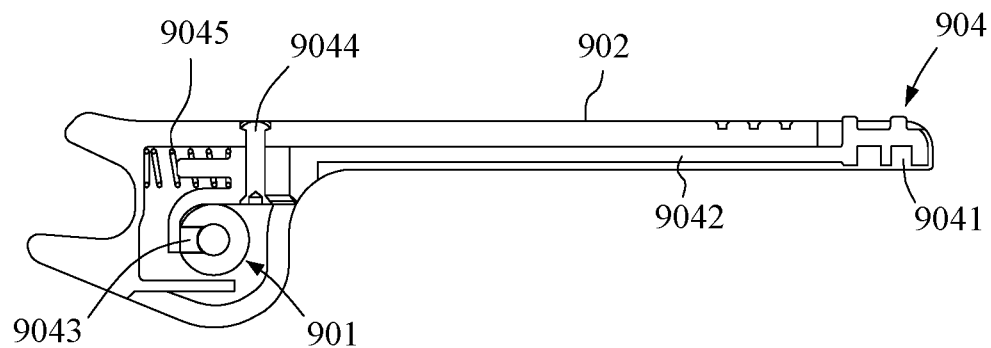
Figure 44:
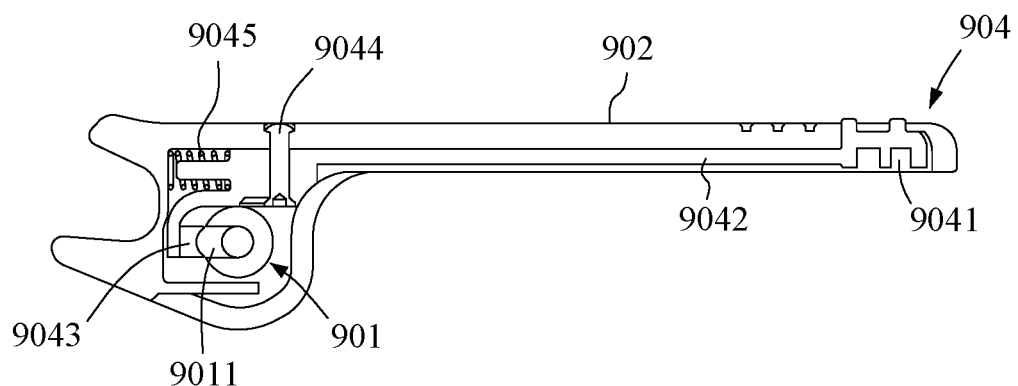
Figure 45:
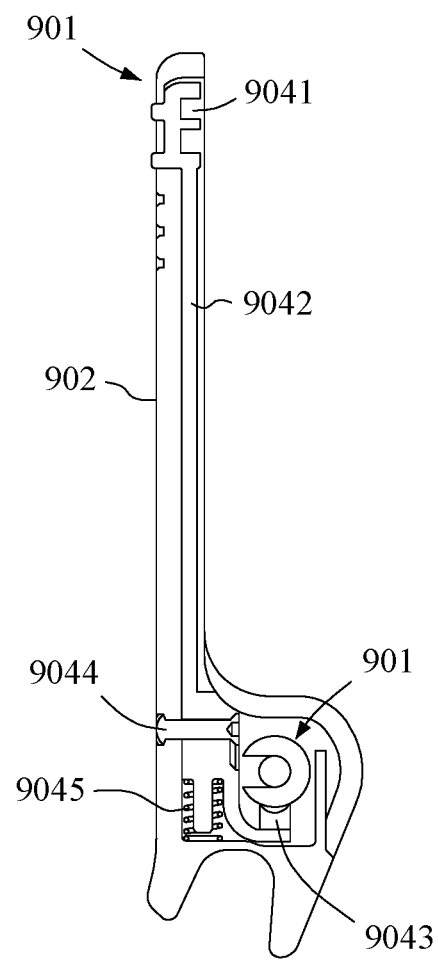
Figure 46:
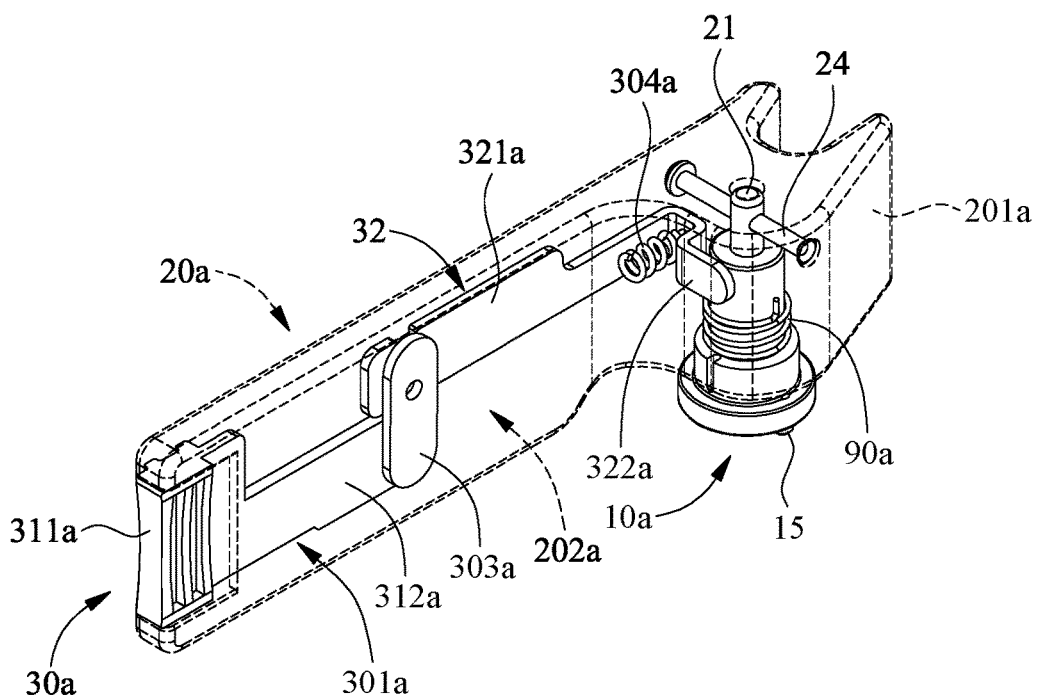
FIG. 46 is a schematic perspective view of the locking state of the fifteenth embodiment of the present invention.
Figure 47:
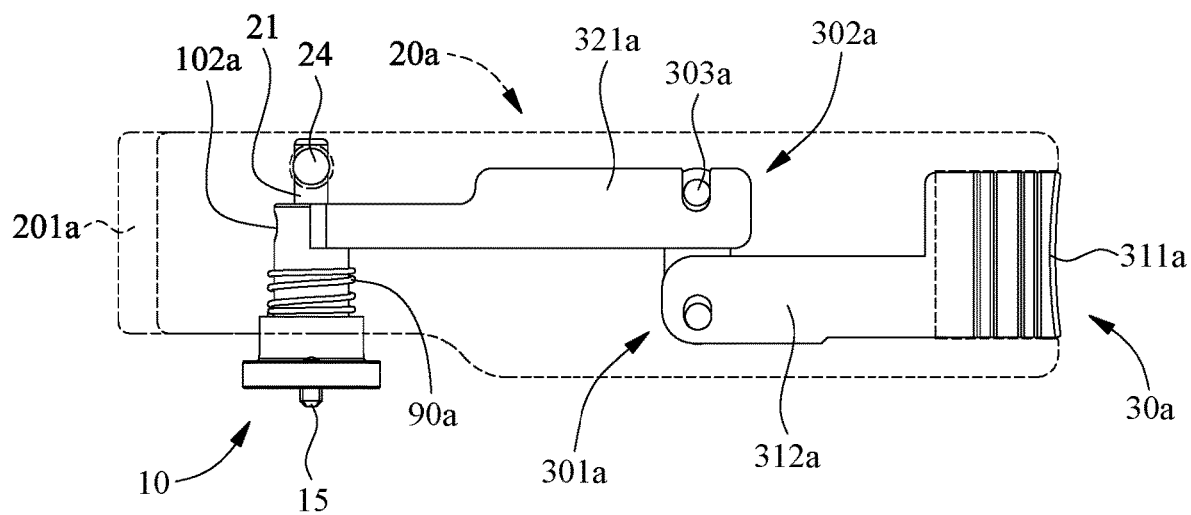
FIG. 47 is a schematic side view of the locking state of the fifteenth embodiment of the present invention.
Figure 48:
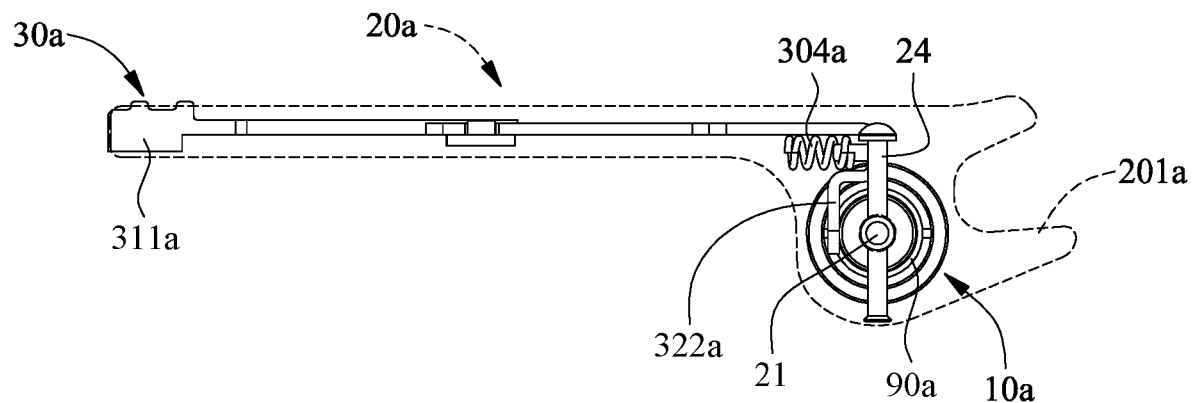
FIG. 48 is a schematic top view of the locking state of the fifteenth embodiment of the present invention.
Figure 49:
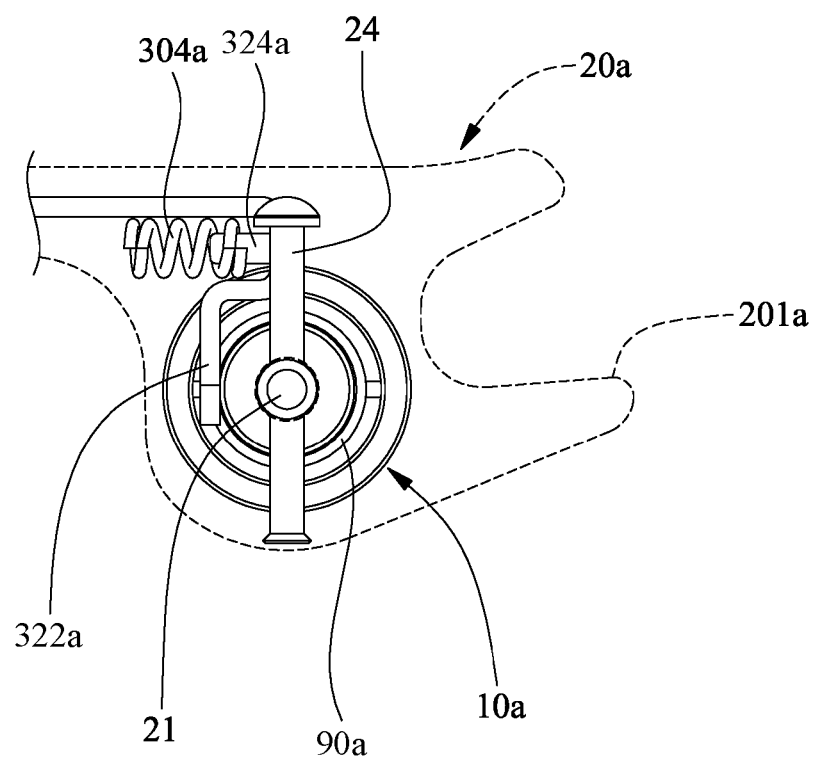
FIG. 49 is a partially enlarged schematic view of the locking state of the fifteenth embodiment of the present invention.
Figure 50:
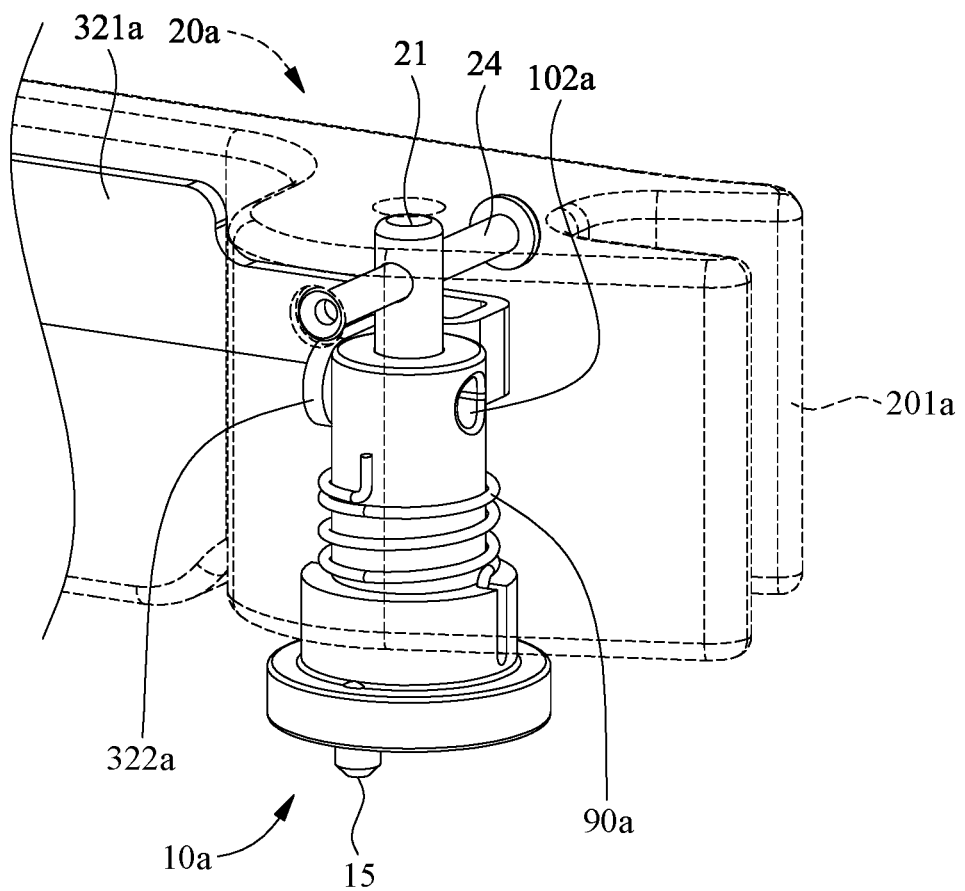
FIG. 50 is another partially enlarged schematic view of the locking state of the fifteenth embodiment of the present invention.
Figure 51:
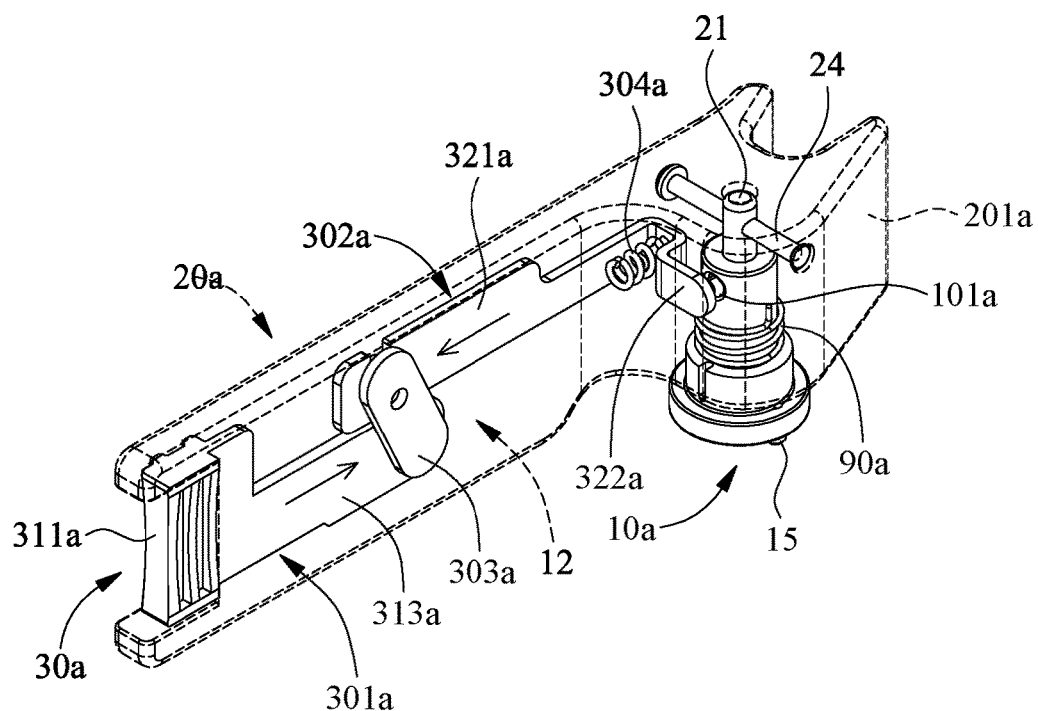
FIG. 51 is a schematic perspective view of the unlocking state of the fifteenth embodiment of the present invention.
Figure 52:
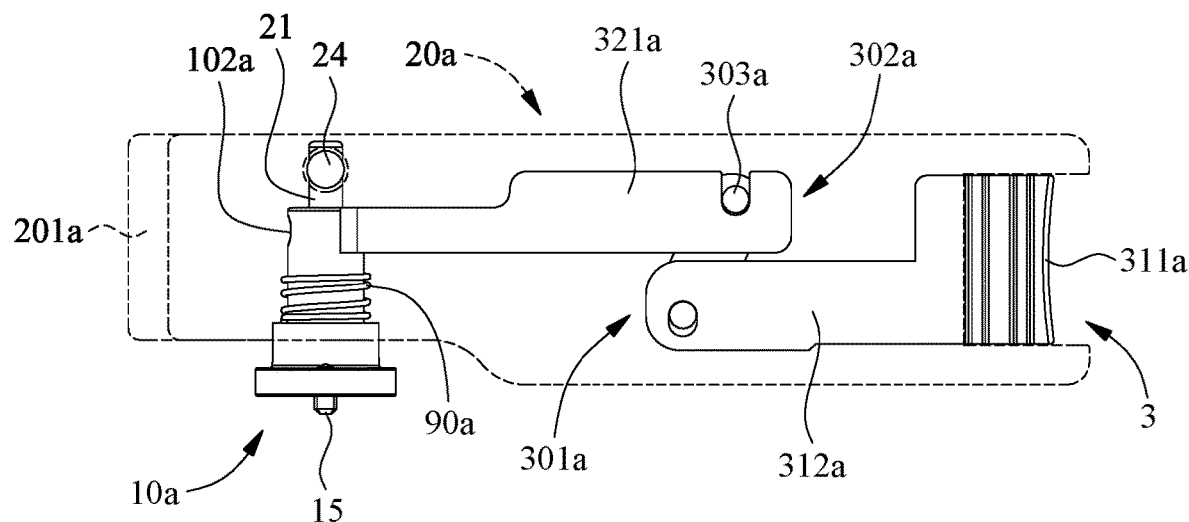
FIG. 52 is a schematic side view of the unlocking state of the fifteenth embodiment of the present invention.
Figure 53:
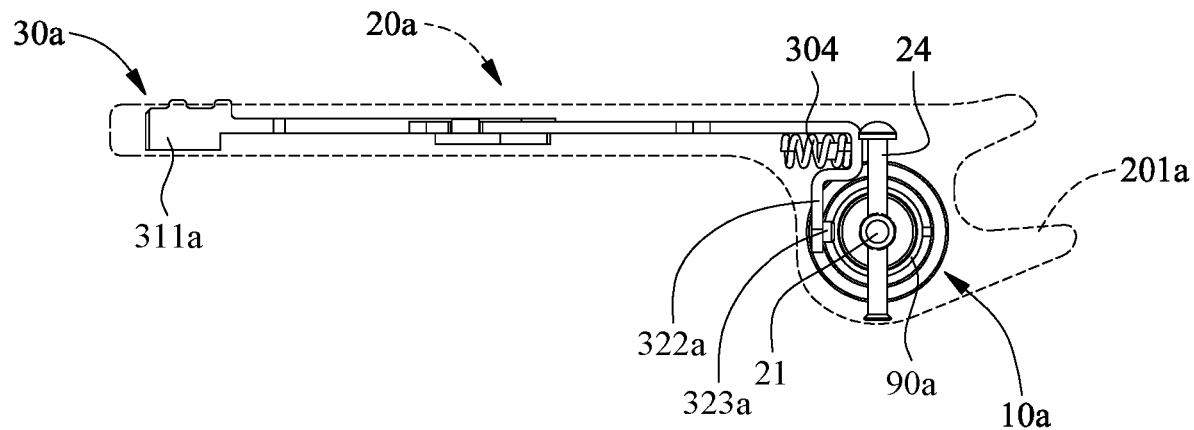
FIG. 53 is a schematic top view of the unlocking state of the fifteenth embodiment of the present invention.
Figure 54:
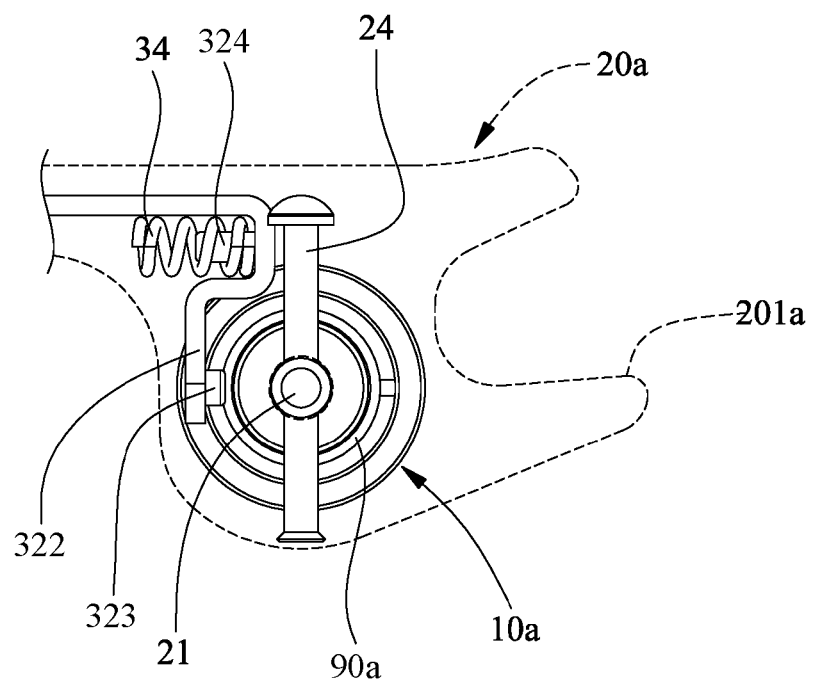
FIG. 54 is a partially enlarged schematic view of the unlocking state of the fifteenth embodiment of the present invention.
Figure 55:
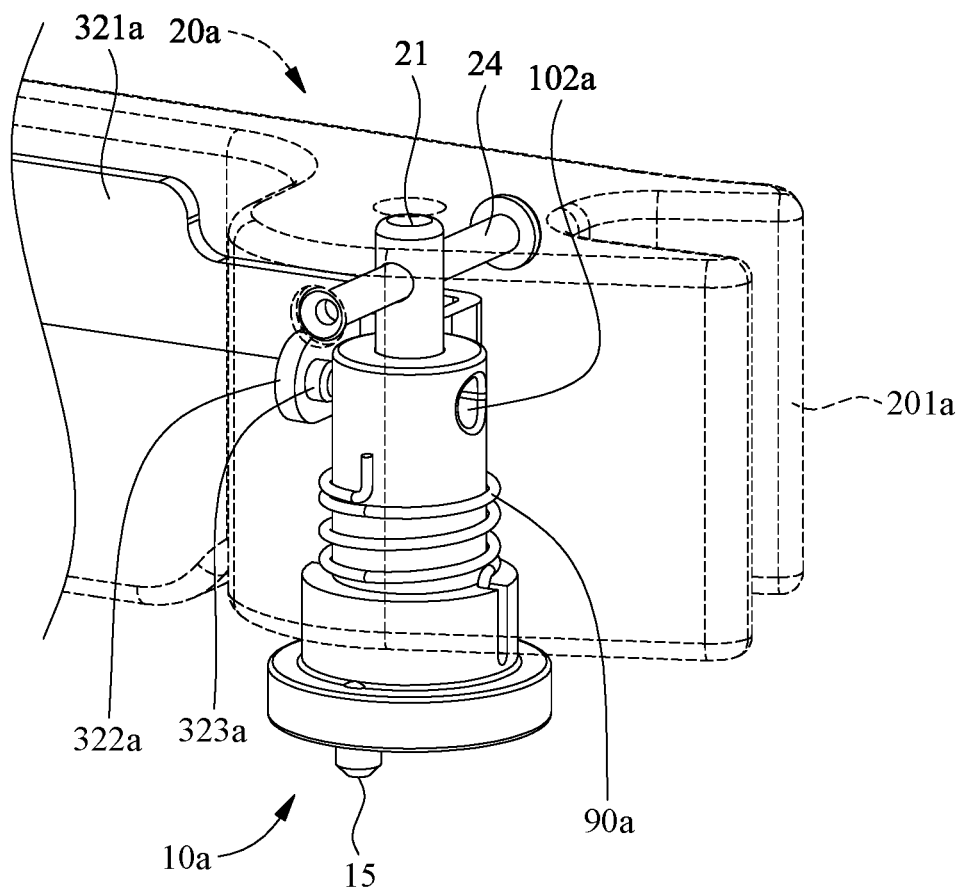
FIG. 55 is another partially enlarged schematic view of the unlocking state of the fifteenth embodiment of the present invention.
Figure 56:
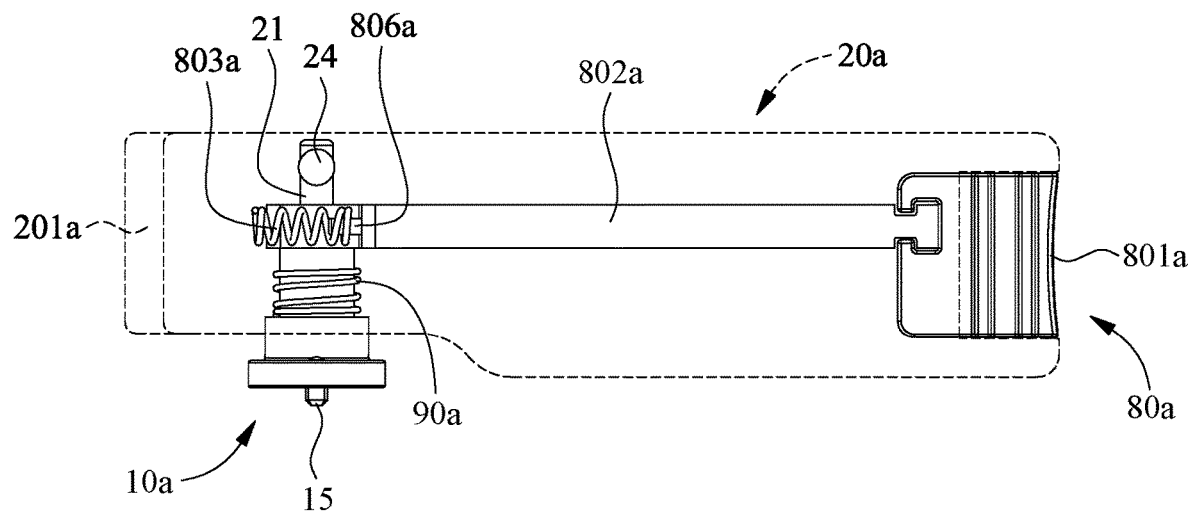
FIG. 56 is a schematic side view of the locking state of the sixteenth embodiment of the present invention.
Figure 57:
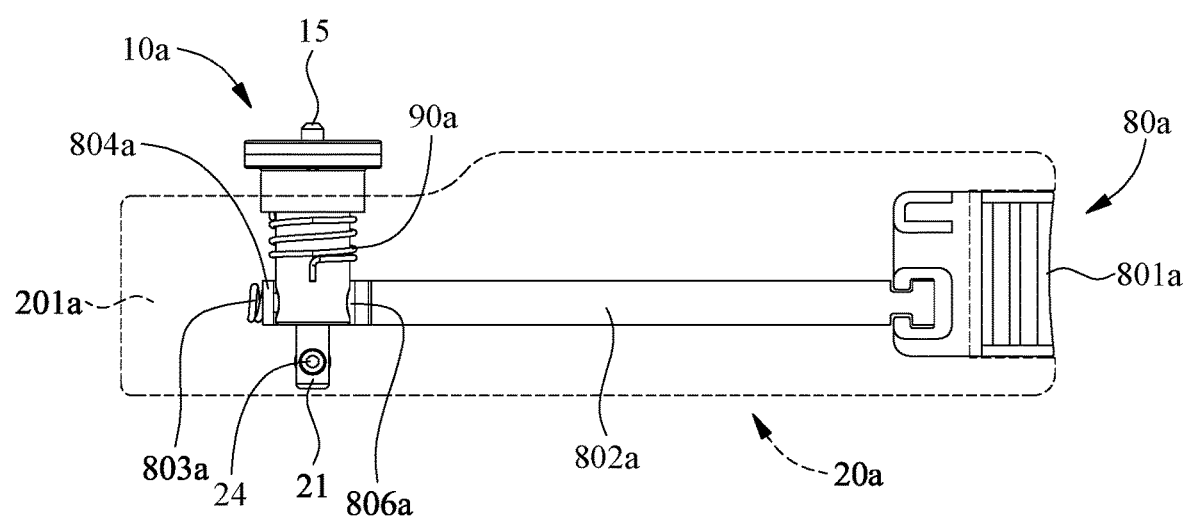
FIG. 57 is another schematic side view of the locking state of the sixteenth embodiment of the present invention.
Figure 58:
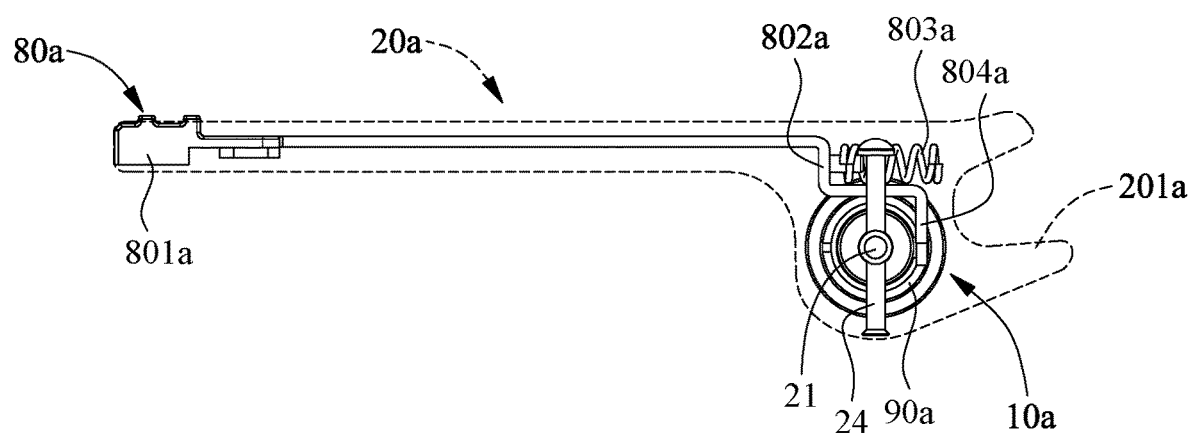
FIG. 58 is a schematic top view of the locking state of the sixteenth embodiment of the present invention.
Figure 59:
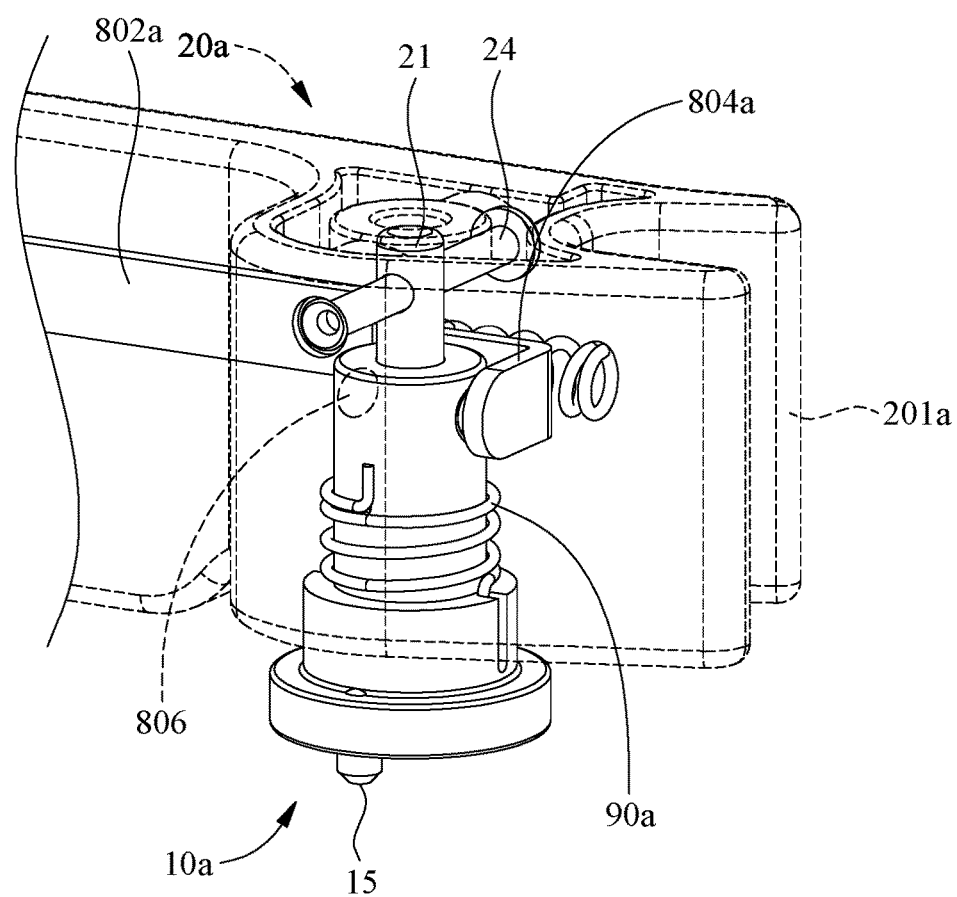
FIG. 59 is a partially enlarged schematic view of the locking state of the sixteenth embodiment of the present invention.
Figure 60:
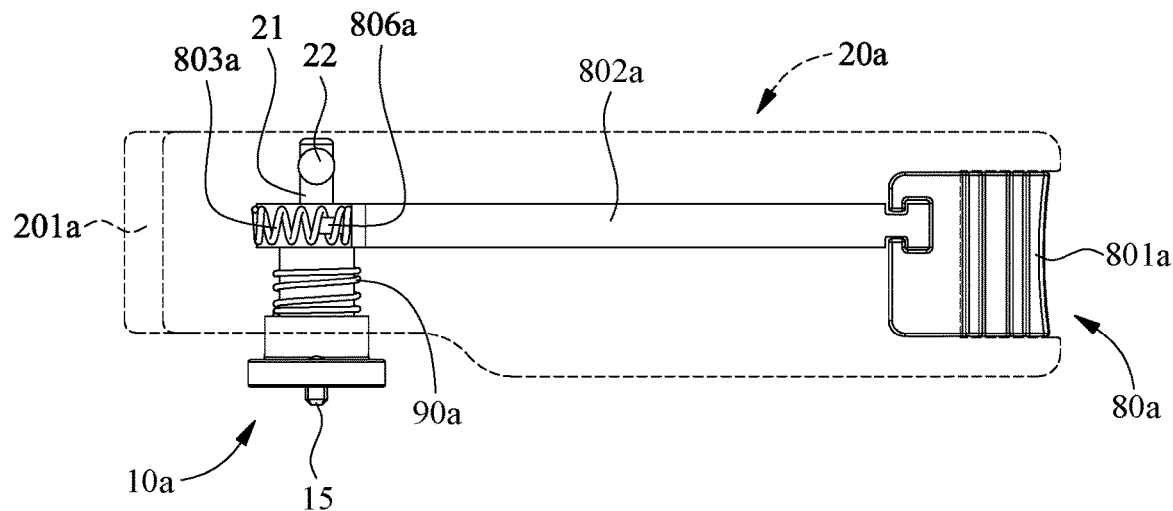
FIG. 60 is a schematic side view of the unlocking state of the sixteenth embodiment of the present invention.
Figure 61:
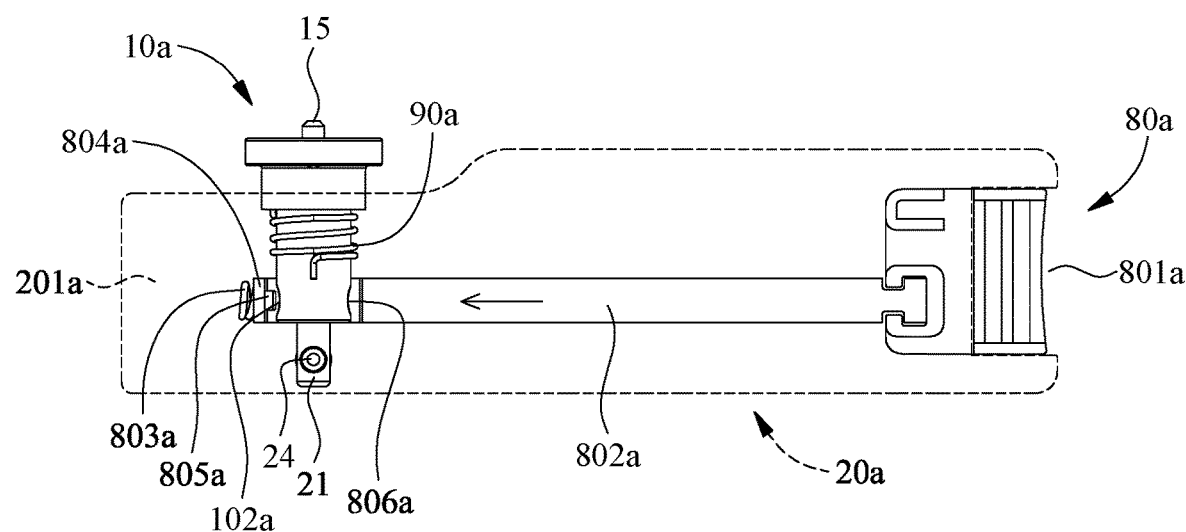
FIG. 61 is another schematic side view of the unlocking state of the sixteenth embodiment of the present invention.
Figure 62:
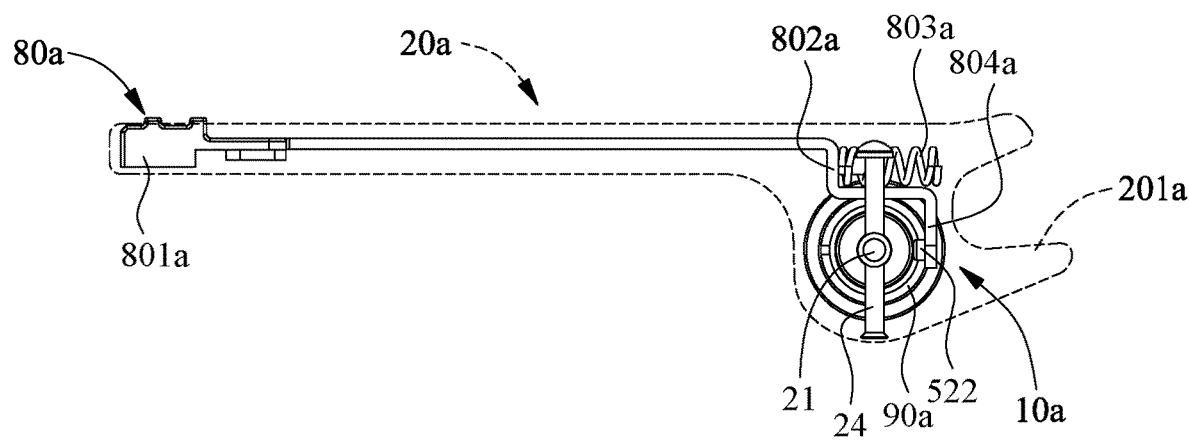
FIG. 62 is a schematic top view of the unlocking state of the sixteenth embodiment of the present invention.
Figure 63:
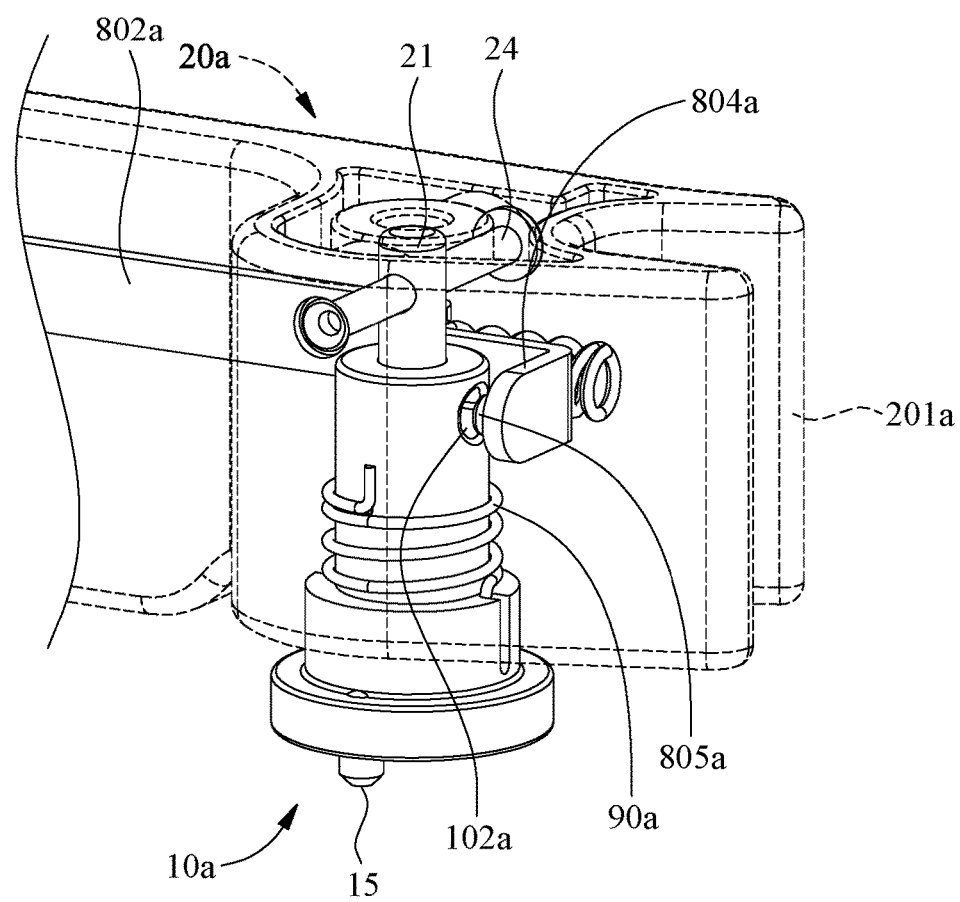
FIG. 63 is a partially enlarged schematic view of the unlocking state of the sixteenth embodiment of the present invention.
Figure 64:
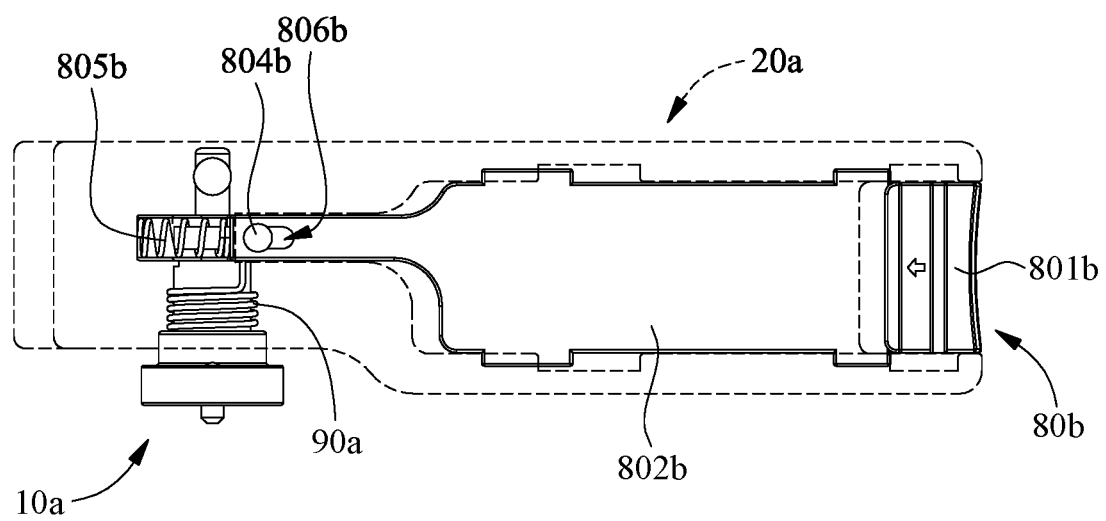
FIG. 64 is a schematic perspective view of the locking state of the seventeenth embodiment of the present invention.
Figure 65:
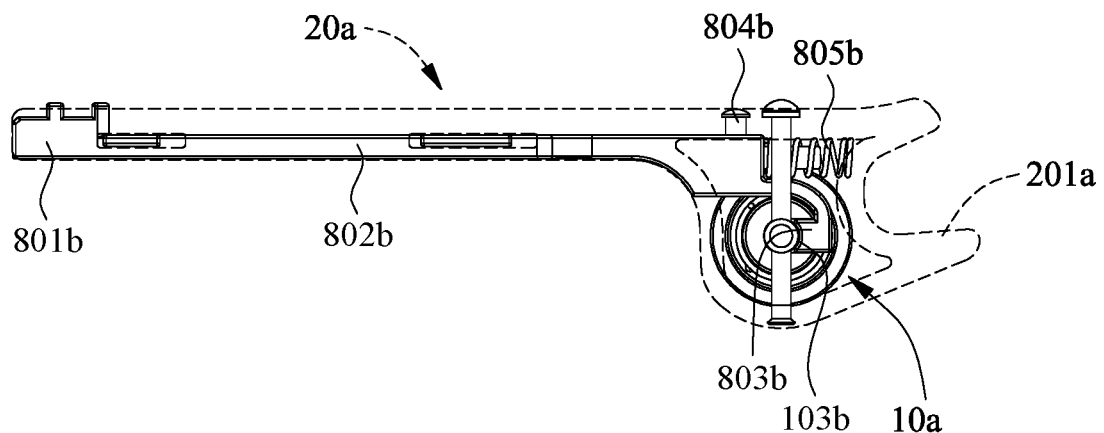
FIG. 65 is a schematic top view of the locking state of the seventeenth embodiment of the present invention.
Figure 66:
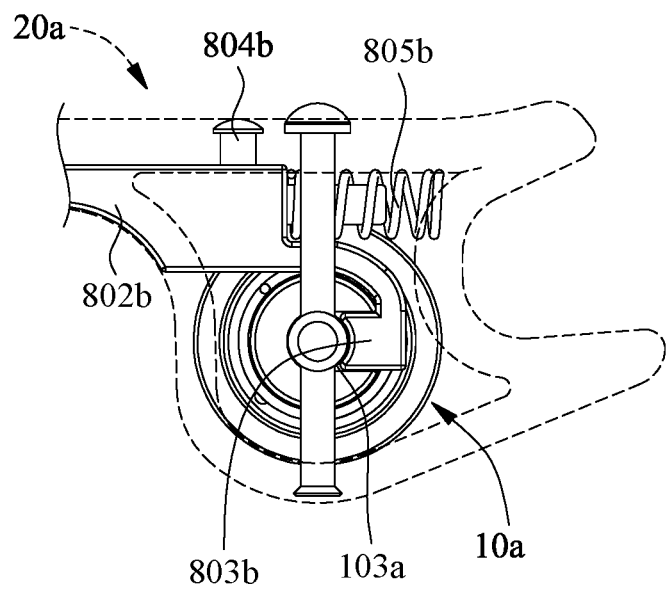
FIG. 66 is a partially enlarged schematic view of the locking state of the seventeenth embodiment of the present invention.
Figure 67:
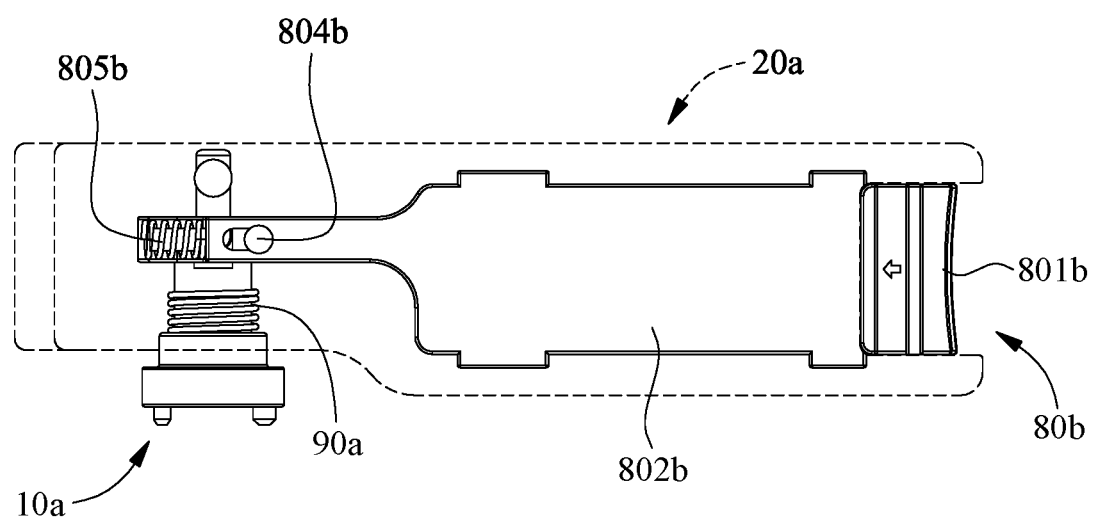
FIG. 67 is a schematic perspective view of the unlocking state of the seventeenth embodiment of the present invention.
Figure 68:
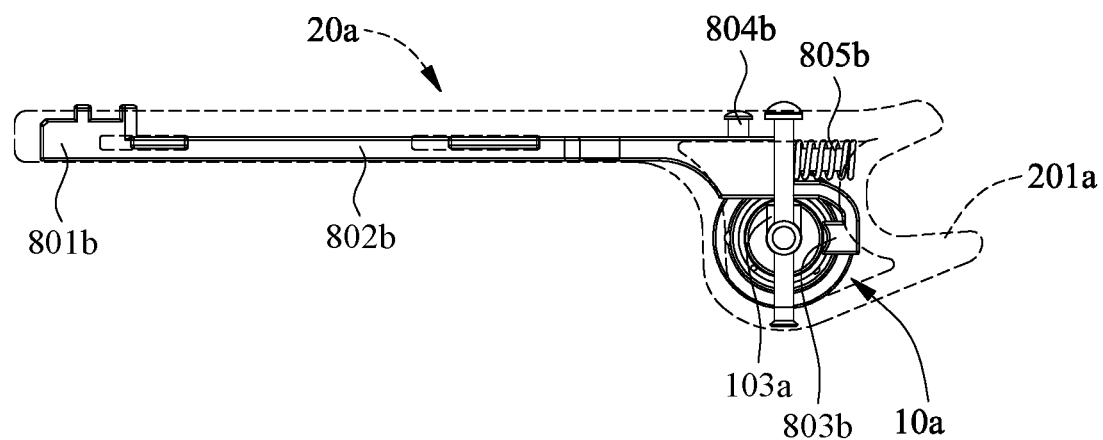
FIG. 68 is a schematic top view of the unlocking state of the seventeenth embodiment of the present invention.
Figure 69:
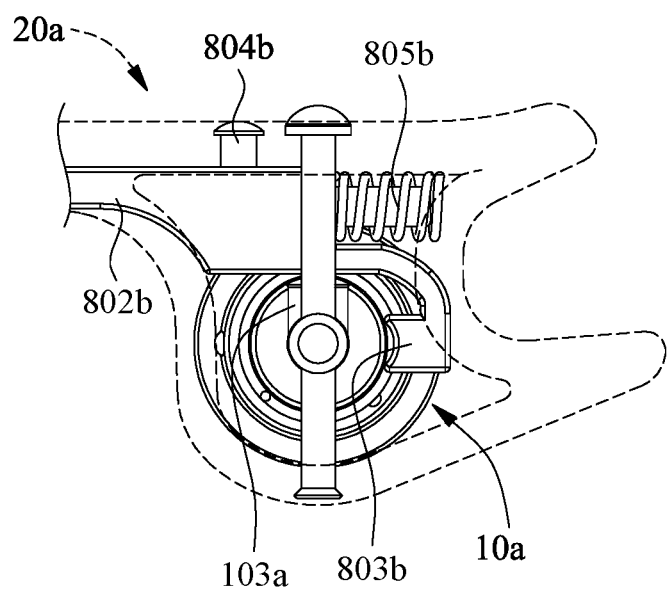
FIG. 69 is a partially enlarged schematic view of the unlocking state of the seventeenth embodiment of the present invention.
Figure 70:
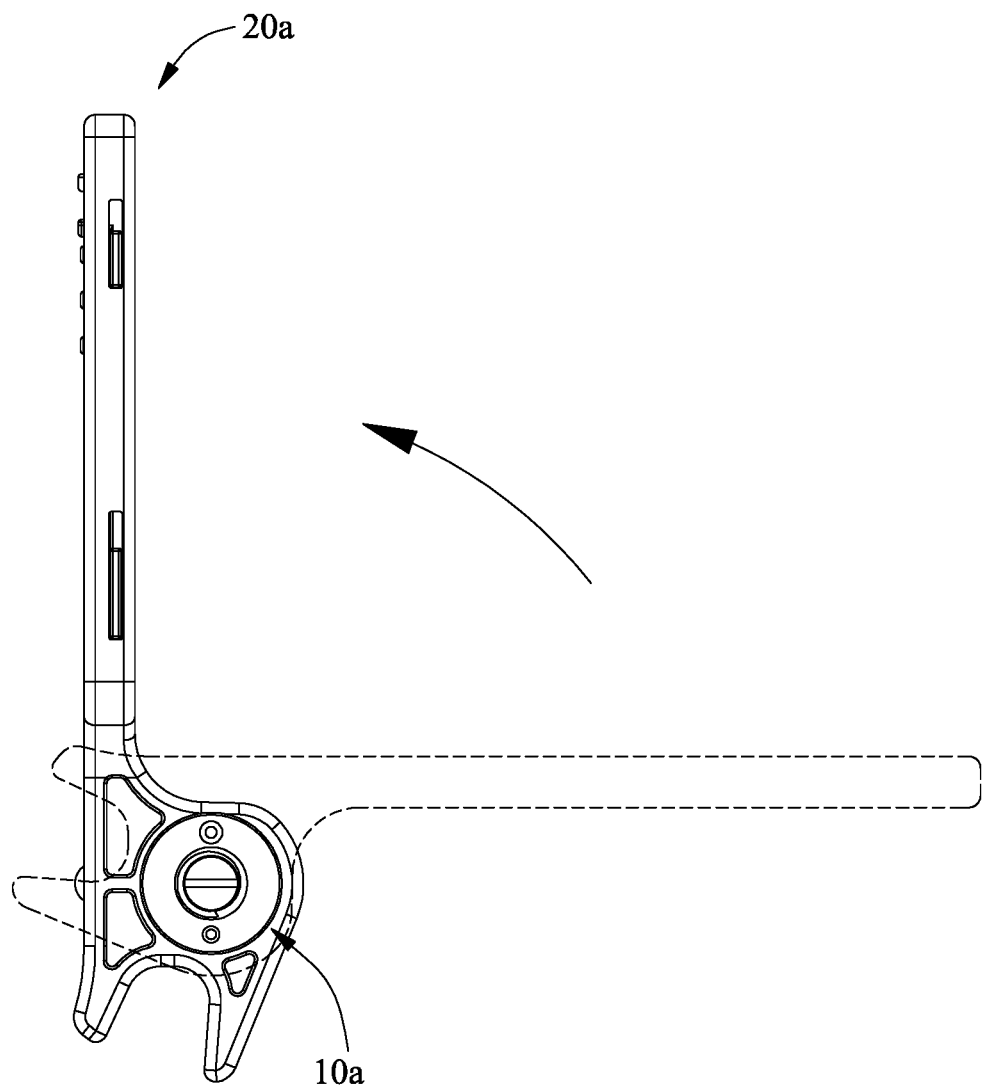
FIG. 70 is a schematic rotary view of the unlocking state of the seventeenth embodiment of the present invention.
Figure 71:
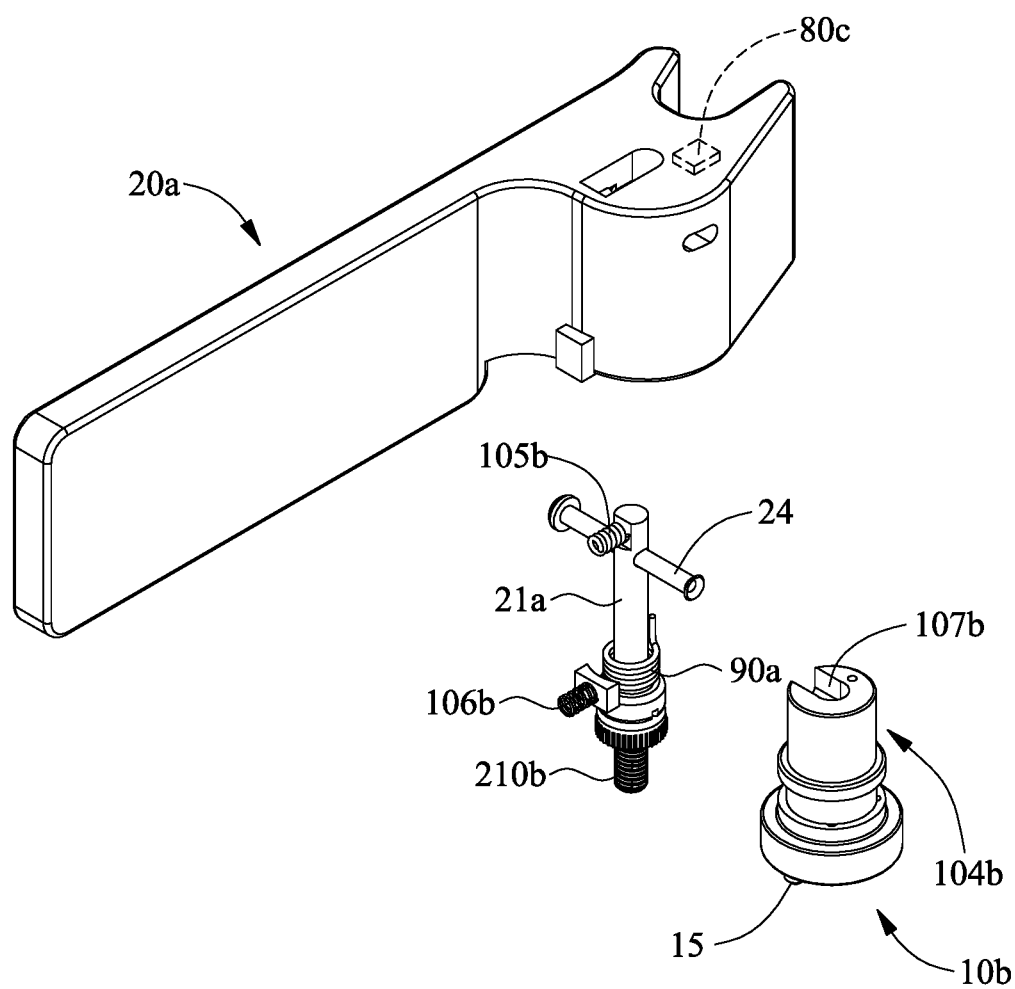
FIG. 71 is a schematic exploded view of the eighteenth embodiment of the present invention.
Figure 72:
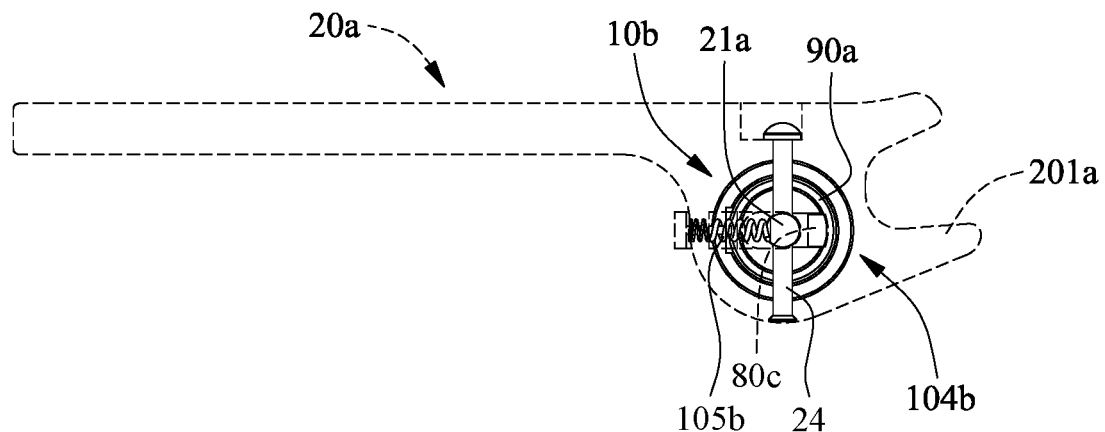
FIG. 72 is a schematic top view of the locking state of the eighteenth embodiment of the present invention.
Figure 73:
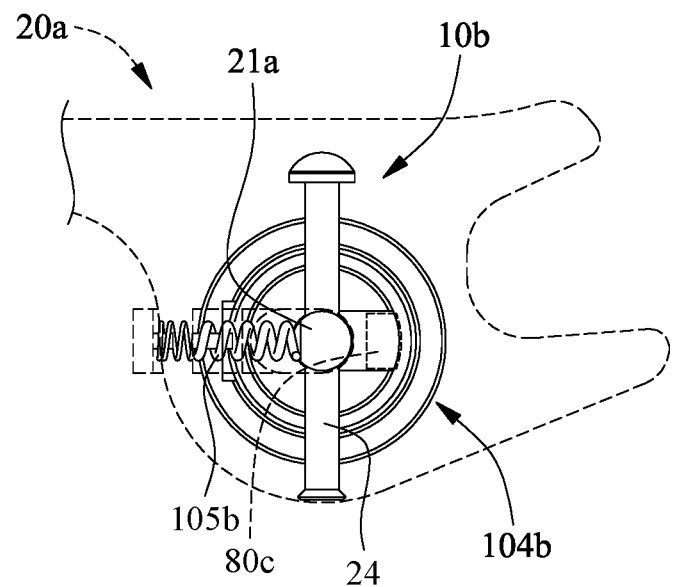
FIG. 73 is a partially enlarged schematic view of the locking state of the eighteenth embodiment of the present invention.
Figure 74:
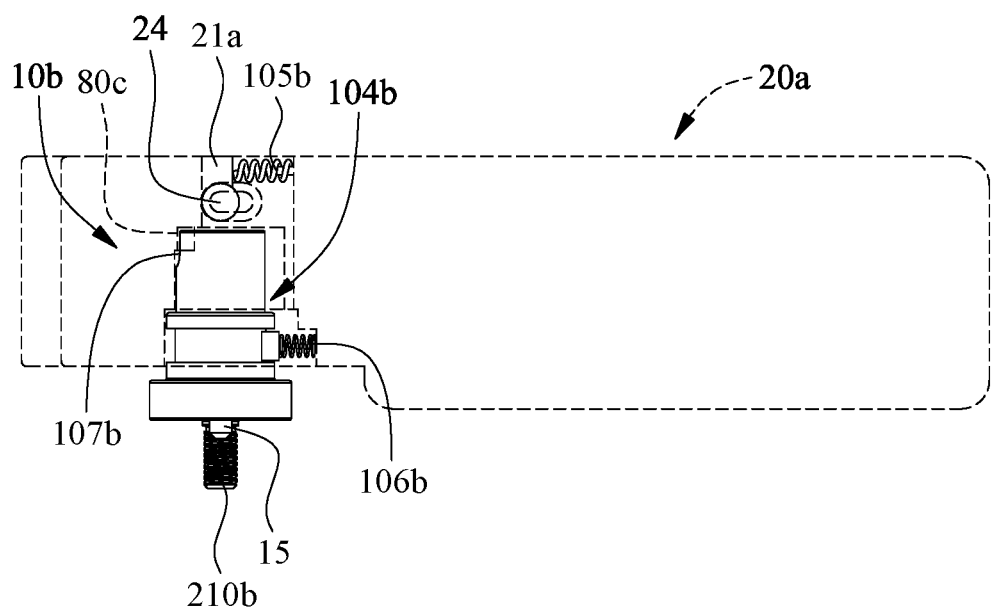
FIG. 74 is another partially enlarged schematic view of the locking state of the eighteenth embodiment of the present invention.
Figure 75:
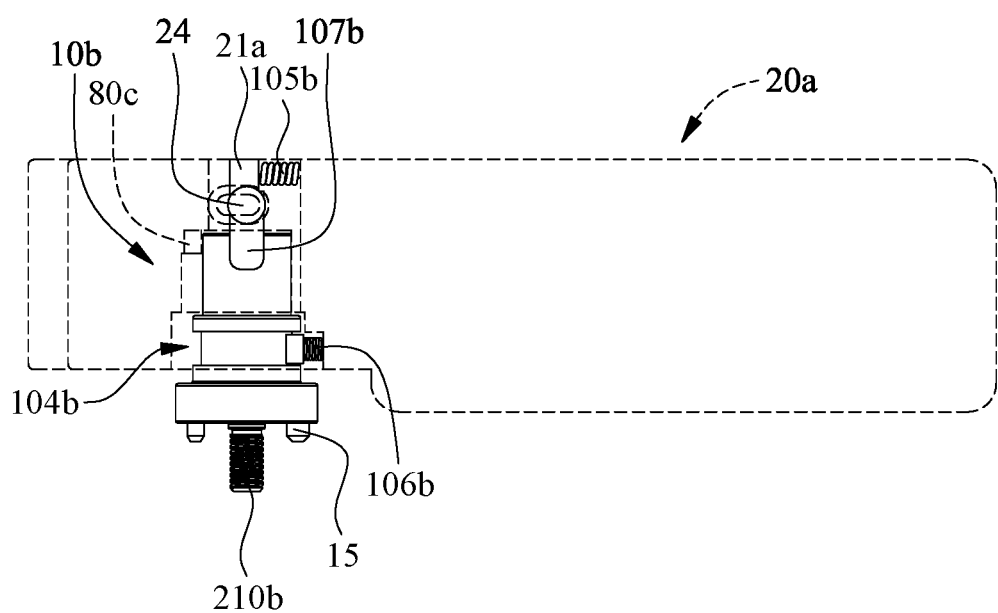
FIG. 75 is a schematic perspective view of the unlocking state of the eighteenth embodiment of the present invention.
Figure 76:
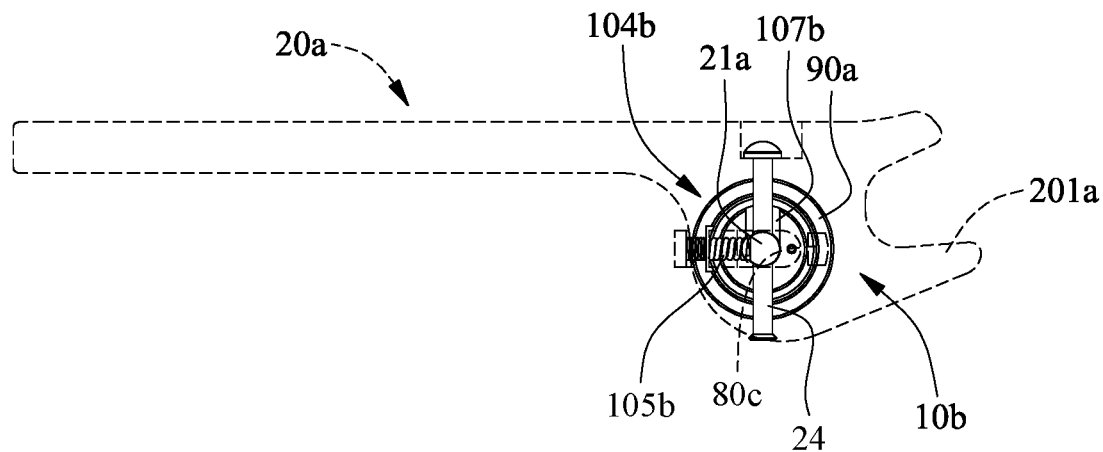
FIG. 76 is a schematic top view of the unlocking state of the eighteenth embodiment of the present invention.
Figure 77:
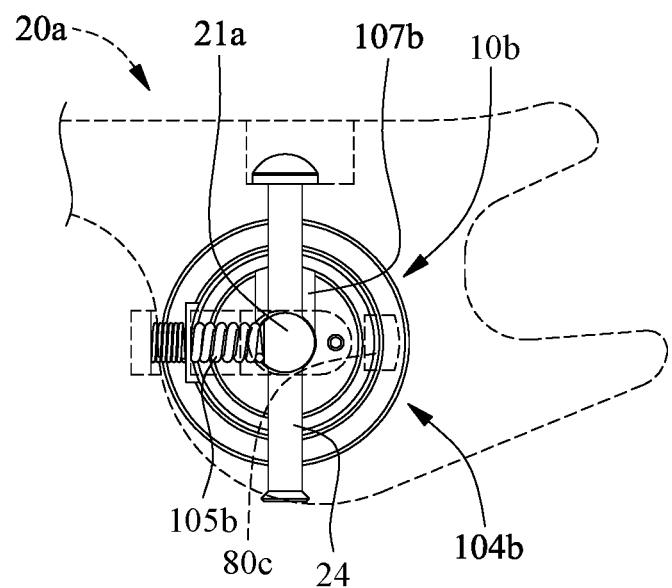
FIG. 77 is a partially enlarged schematic view of the unlocking state of the eighteenth embodiment of the present invention.
Figure 78:
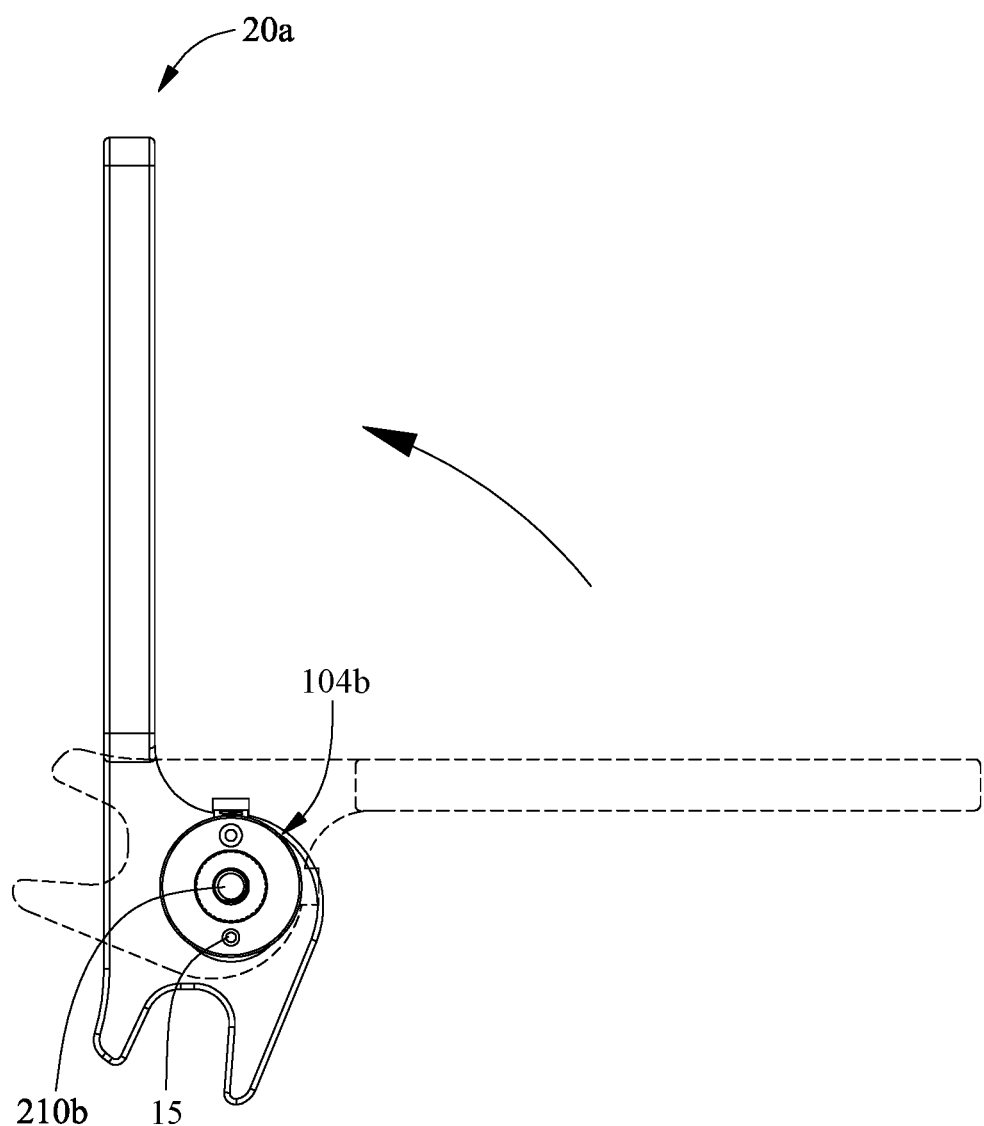
FIG. 78 is a schematic rotary view of the unlocking state of the eighteenth embodiment of the present invention.

Referring to FIG. 36, which is a schematic view of the rotary motion structure according to the twelfth embodiment of the present invention. In this embodiment, the rotating member 20 has an action space 201 for allowing the positioning piece 91*a* to move within the action space 201 in cooperation with the limiting body 94*a*.

Referring to FIGS. 37-41, which are schematic views of the thirteenth embodiment of the present invention. In this embodiment, the rotating member 100 and the shaft portion 101 are combined with the engaging piece 102, which is a plug, a cylinder, or a fastener integrally formed with the rotating member 100 or the shaft portion 101. The rotating member 100 has a limiting buckling portion 1001, and the limiting member 103 has a limited buckling portion 1031 mutually buckling or interfering with the limiting buckling portion 1001. After released from the limiting buckling portion 1001, the limited buckling portion 1031 may rotate. The limiting buckling portion 1001 and the limited buckling portion 1031 are each a hook, a cylinder, a protrusion, a recess, a step-shaped body, a plane, a curved surface, or an arc surface.

In addition, the rotating member 100 has a longitudinal movement space 1002 and a lateral movement space 1003. The movement distance of the longitudinal movement space is in the range of 0.1 mm to 200 mm so that the shaft portion 101 moves in the longitudinal movement space 1002. The engaging piece 102 moves in the lateral movement space 1003, and the movement distance of the lateral movement space is in the range of 0.1 mm to 200 mm. There is an abutment elastic member 104 between the rotating member 100 and the limiting member 103 for allowing the rotating member 100 to be abutted upon a disposed location or one end of the longitudinal movement space 1002 and the lateral movement space 1003.

Referring to FIGS. 42 to 45, which are schematic views of the fourteenth embodiment of the present invention. In this embodiment, the rotating member 902 is further provided with a pushing member 904, which is movably combined with the limiting member 901. The limiting member 901 is provided with a butting portion 9011 for movably combined with the pushing member 904. The pushing member 904 includes a pressing portion 9041 exposed at one end of the rotating member 902, an actuating arm 9042 connecting the pressing portion 9041, a fastening portion 9043 connecting the actuating arm 9042 and movably engaged with the butting portion 9011, a guide rod 9044 provided between the rotating member 902 and the actuating arm 9042, and an elastic portion 9045 provided between the actuating arm 9042 and the rotating member 902.

When it is desired to detach two articles that have been coupled through the cooperation of the rotating member 902 and the limiting member 901 (not shown), the pressing portion 9041 of the pushing piece 904 is pressed so that the actuating arm 9042 drives the fastening portion 9043 to be released from the butting portion 9011 of the limiting member 901 and presses the elastic portion 9045. Meanwhile, the rotating member 902 is rotated on the limiting member 901 by the release force of the elastic member 903 so that the rotating member 902 is automatically ejected by the driving of the elastic member 903, allowing the pushing piece 904 and the limiting member 901 to be unlocked and achieving fast coupling and easy detachment.

Referring to FIGS. 46-55, as shown in the figures, the rotary motion structure 1 of the present invention further comprises a limiting member 10a, a rotating member 20a, a positioning member 30a, and an elastic member 90a.

The rotating member 20a has an abutting portion 201a at one end thereof, and the abutting portion 201a is used to push or buckle an object coupling with the abutting portion 201a. In the embodiment of the present invention, the abutting portion 201a may be a fastening structure or a top-push structure, and the rotating member 20a has a receiving space 202a. The shaft portion 21 connects with the rotating member 20a by the engaging piece 24, which may be a shaft, a fastener, or a cylinder, or integrally formed with the shaft portion 21.

The limiting member 10a is movably provided in the receiving space 202a of the rotating member 20a. An engaging portion 15 is provided at the bottom surface of the limiting member 10a. The limiting member 10a is provided with at least two butting portions configured reversely, positively, or laterally. In this embodiment, the butting portions may be a first butting hole 101a and a second butting hole 102a for movably combining with or being limited to or interfering with or fastening the positioning member 30a. The engaging portion 15 may be a protrusion, a recess, an externally threaded body, an internally threaded body, a fastener, a layered body, a plane, an arc surface, a curved surface or a bevel for engaging an article by riveting, expanding, locking, welding, buckling, bonding, or plugging.

The positioning member 30a is provided in the receiving space 202a of the rotating member 20a and is movably combined with (or limited to or interfered with or fastened upon) the limiting member 10a. The positioning member 30a includes a push rod 301a, an actuating arm 302a, an engaging body 303a connecting the push rod 301a with the push rod 301a, and an elastic portion 304a provided between the actuating arm 302a and the rotating member 20a. The push rod 301a has a pressing portion 311a exposed at one end of the rotating member 20a, and a shaft 312a connecting the engaging body 303a. The actuating arm 302a has an extension portion 321a connecting the engaging body 303a, a bent portion 322a connecting the extension portion 321a and corresponding to the limiting member 10a and the elastic portion 304a, an butting portion 323a provided at the bent portion 322a and movably combined with (or limited to or interfered with or fastened upon) the first butting hole 101a or the second butting hole 102a, and a positioning unit 324a for coupling the elastic portion 304a, which may be a coil spring, a disc-type shrapnel, a C-type shrapnel, a wave-type shrapnel, an elastic cylinder, a shrapnel, or a torsion spring.

The elastic member 90a is provided at the limiting member 10a, and two ends thereof are configured at the rotating member 20a and the limiting member 10a, respectively. The elastic member 90a is a coil spring, a disc-type shrapnel, a C-type shrapnel, a wave-type shrapnel, an elastic cylinder shrapnel, or a torsion spring. By the abutment of both ends, the elastic member 90a can make the rotating member 20a rotate flexibly by 5 to 360 degrees with respect to the limiting member 10a.

When the present invention is applied, the engaging portion 15 at the bottom surface of the limiting member 10a may be coupled with an article, and the rotating member 20a is then rotated about the shaft portion 21 of the limiting member 10a so that the abutting portion 201a at one end of the rotating member 20a buckles another article (not shown). Meanwhile, the abutting portion 323a of the actuating arm 302a provided at the positioning member 30a is embedded into the first butting hole 101a of the limiting member 10a, and the elastic member 90a is pressed simultaneously to interlock the positioning member 30a with the limiting member 10a, thereby completing the coupling of two articles. Further, the rotary motion structure of the present invention can be combined with an object (not shown) to form a module, wherein the object may be a board, a box, a sheet, a block, a main board or casing.

When the two articles are to be detached, the pressing portion 311 of the push rod 301a provided at the positioning member 30a is pressed so that the shaft 312 of the push rod 301a drives the engaging body 303a to pull the extension portion 321a of the actuating arm 302a, allowing the bent portion 322a of the actuating arm 302a to move away from the limiting member 10a and compress the elastic portion 304a to separate the butting portion 323a from the first butting hole 101a. Meanwhile, the rotation member 20a is rotated on the limiting member 10a by the release force of the elastic member 90a and then ejected automatically due to the driving of the elastic member 90a, resulting an unlocking state of the positioning member 30a and the limiting member 10a. Also, the rotation of the rotating member 20a drives the abutting portion 323a to be embedded into the second abutment hole 102a, which in turn exerts a force on the rotating member 20a due to the release of the elastic member 90a to move one article, and the abutting portion 201a is moved away from the other article to detach the two articles, achieving the efficacy of fast coupling and easy detachment.

Referring to FIGS. 56-63, as shown in the figure, in this embodiment, the positioning member 80a includes a pressing portion 801a exposed at one end of the rotating member, an actuating arm 802a connecting the pressing portion 801a, and an elastic portion 803a provided between the actuating arm 802a and the rotating member 20a, wherein the pressing portion 801a is engaged with the actuating arm 802a by buckling, bonding, locking, riveting, expanding, wedging, fastening, or integral molding. The actuating arm 802a has a bent portion 804a corresponding to the limiting member 10a and the elastic portion 803a, a corresponding portion 805a provided at the bent portion 804a and movably combined with (or limited to or interfered with or fastened upon) the second butting hole 102a or the first butting hole 101a, and a positioning unit 806a for coupling the elastic portion 803a. The corresponding portion 805a may be a protrusion, a recess, an externally threaded body, an internally threaded body, a fastener, a layered body, a plane, an arc surface, a curved surface, a bevel, a groove, or a hook, and the positioning unit 806a may be a groove portion, a hole portion, a tip portion, a protruding portion, a recessed portion, a layered portion, a plane portion, a bevel portion, an arc surface portion, or a curved surface portion.

In this way, the engaging portion 15 at the bottom surface of the limiting member 10a may be coupled with an article, and then the rotating member 20a is rotated about the shaft portion 21 of the limiting member 10a so that the abutting portion 201a at one end of the rotating member 20a buckles another article (not shown). Meanwhile, the abutting portion 805a of the actuating arm 802a provided at the positioning member 30a is embedded into the second butting hole 102a of the limiting member 10a, and the elastic member 90a is pressed simultaneously to interlock the positioning member 80a with the limiting member 10a, thereby completing the coupling of two articles.

When the two articles are to be detached, the pressing portion 801a of the positioning member 80a is pressed so that the bent portion 804a of the actuating arm 802a is moved away from the limiting member 10a and compresses the elastic portion 803a to separate the corresponding portion 805a from the second butting hole 102a. Meanwhile, the rotating member 20a is rotated on the limiting member 10a by the release force of the elastic member 90a and then ejected automatically due to the driving of the elastic member 90a, resulting an unlocking state of the positioning member 80a and the limiting member 10a. Also, the rotation of the rotating member 20a drives the abutting portion 805a to be embedded into the first abutment hole 101a, which in turn exerts a force on the rotating member 20a due to the release of the elastic member 90a and allows the abutting portion 201a to move the other article away, thereby separating the two articles and achieving the efficacy of fast coupling and easy detachment.

Referring to FIGS. 64-70, as shown in the figures, in this embodiment, the limiting member 10a is provided with a butting portion 103a for movably combining with (or limiting to or interfering with or fastening) the positioning member 80b. The positioning member 80b is assembled with dislocation and then wedged in the rotating member 20a. The positioning member 80b includes a pressing portion 801b exposed at one end of the rotating member 20a, an actuating arm 802b connecting the pressing portion 801b, a corresponding portion 803b connecting the actuating arm 802b and movably combining with (or limiting to or interfering with or fastening) the butting portion 103a, an engaging body 804b provided between the rotating member 20a and the actuating arm 802b, and an elastic portion 805b provided between the actuating arm 802b and the rotating member 20a. The butting portion 103a may be a hole, a groove, a protrusion, a recess, a layered body, an arc surface body, a plane body, a bevel body, a curved surface body, or a fastener. The positioning member 80b is movably engaged with the rotating member 20a through the engaging body 804b. The engaging body 804b may be a guide rod, a plug, a fastener, or a cylinder. The actuating arm 802b of the positioning member 80b (or the rotating member 20a) is provided with an action portion 806b for the positioning member 80a to act laterally (or longitudinally) in cooperation with the engaging body 804b. The action space of the action portion 806b is between 0.05 mm and 500 mm.

When it is desired to detach two articles that have been coupled through the cooperation of the rotating member 20a and the limiting member 10a, the pressing portion 801b of the positioning member 80b is pressed so that the actuating arm 802b drives the corresponding portion 803b to be released from the butting portion 103a of the limiting member 10a and presses the elastic portion 805b. Meanwhile, the rotating member 20a is rotated on the limiting member 10a by the release force of the elastic member 90a so that the rotating member 20a is automatically ejected by the driving of the elastic member 90a, allowing the positioning member 80b and the limiting member 10a to be unlocked and achieving fast coupling and easy detachment.

Referring to FIGS. 71-78, as shown in the figures, in this embodiment, the rotating member 20a is separately coupled with the shaft portion 21a. The shaft portion 21 connects with the rotating member 20a through an engaging piece 24. The limiting member 10b further includes a limiting piece 104b provided at the shaft portion 21a, a first pushing piece 105b provided between the rotating member 20a and the shaft portion 21a, and a second pushing piece 106b provided between the rotating member 20a and the limiting piece 104b. The elastic member 90a is sleeved on the shaft portion 21a of the limiting member 10b, and two ends thereof are configured at the shaft portion 21a and the limiting piece 104b, respectively. An engaging portion 15 is provided at the bottom of the limiting piece 104b. Both the first pushing piece 105b and the second pushing piece 106b are elastic components (e.g., springs). A positioning piece 80c is provided inside the rotating member 20a and movably engaged with the limiting piece 104b. In this embodiment, the positioning piece 80c is a protrusion (or a recess), and the limiting piece 104b has a recessed portion 107b (or a protruding portion) movably engaged with the protrusion (or the recess). The engaging portion 15 may be a protrusion, a recess, an externally threaded body, an internally threaded body, a fastener, a layered body, a plane, an arc surface, a curved surface or a bevel, and the engaging portion 15 is used for engaging an article by riveting, expanding, locking, welding, buckling, bonding, or plugging.

In this way, the engaging portion 15 on the bottom surface of the limiting member 10b and the threaded portion 210b at the bottom of the shaft portion 21a may be coupled with one article, and then the rotating member 20a may be rotated about the shaft portion 21a so that the abutting portion 201a at one end of the rotating member 20a buckles the other article (not shown). Meanwhile, the positioning piece 80c inside the rotating member 20a is lodged in the recessed portion 107b of the limiting piece 104b and the elastic member 90a is compressed simultaneously so that the first pushing piece 105b and the second pushing piece 106b abuts and pushes the shaft portion 21a and the limiting piece 104b to lock the limiting piece 104b on the shaft portion 21a, thereby completing the coupling of two articles.

When the two articles are to be detached, the rotating member 20a is pushed toward one side (in the direction of the abutting portion 201a) to compress the first pushing piece 105b and the second pushing piece 106b, and then the positioning piece 80c inside the rotating member 20a is moved out of the recessed portion 107b of the limiting piece 104b. Meanwhile, the rotating member 20a and the limiting piece 104b may be rotated due to the release force of the elastic member 90a so that both the positioning piece 80c inside the rotating member 20a and the limiting piece 104b exhibits an unlocked state, which subsequently allows the abutting portion 201a leaving the other object, and thereby separating the two articles and achieving the efficacy of fast coupling and easy detachment.

Figure 79:
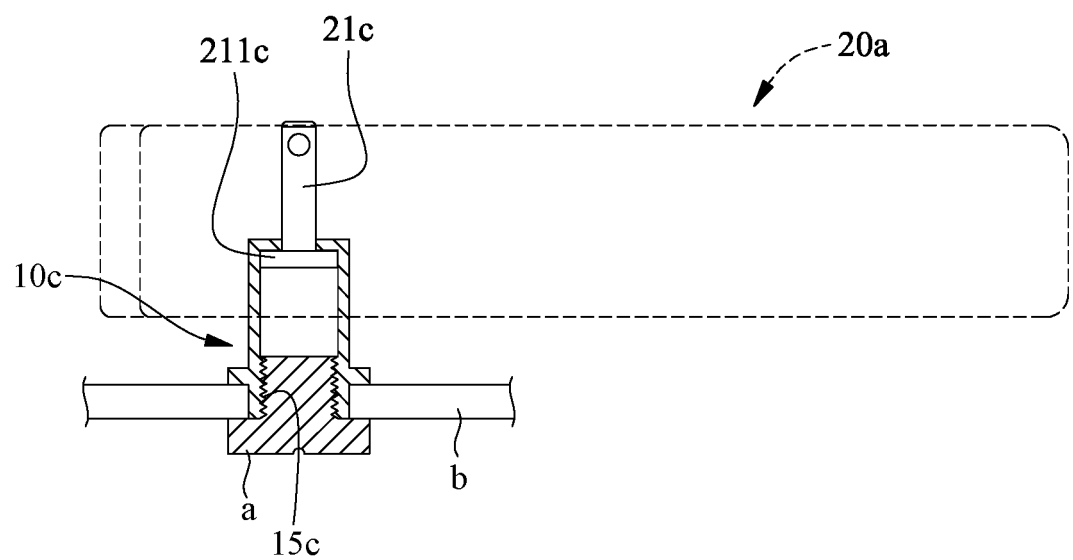
FIG. 79 is a schematic rotary view of the unlocking state of the nineteenth embodiment of the present invention.

Referring to FIG. 79, as shown in the figure, in this embodiment, the shaft portion 21c is provided with a stopper portion 211c, which is engaged with or limited to the limiting member 10c. The engaging portion 15c of the limiting member 10c is an internally threaded body, which may engage and lock an article b in cooperation with a counterlocked piece a. Moreover, the engaging portion 15c may also be a protrusion, a recess, an externally threaded body, a fastener, a layered body, a plane, an arc surface, a curved surface or a bevel (not shown) as needed for engaging an article b by riveting, expanding, locking, welding, buckling, bonding, or plugging (not shown).

Figure 80:
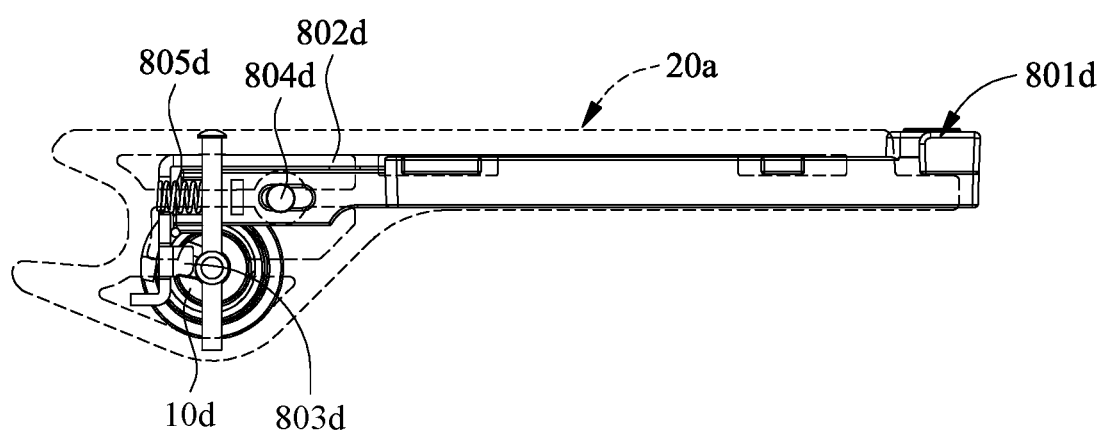
FIGS. 80-81 are schematic views of the twentieth embodiment of the present invention.
Figure 81:
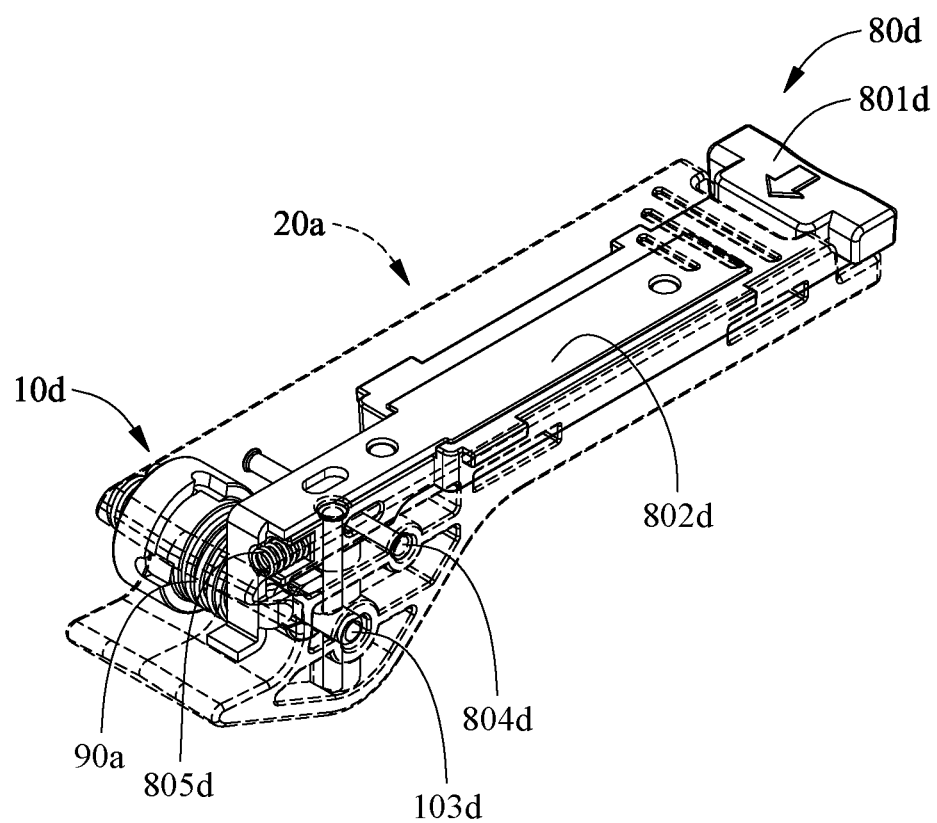

Referring to FIGS. 80-81, as shown in the figures, in this embodiment, the positioning member 80d comprises a pressing portion 801d exposed at one end of the rotating member 20a, an actuating arm 802d connecting the pressing portion 801d, a corresponding portion 803d connecting the actuating arm 802d, an engaging body 804d provided between the rotating member 20a and the pressing portion 801d, and an elastic portion 805d provided between the pressing portion 801d and the rotating member 20a. The limiting member 10d has a butting portion 103d movably combined with (or limited to or interfered with or fastened upon) the corresponding portion 803d.

When it is desired to detach two articles that have been coupled through the cooperation of the rotating member 20a and the limiting member 10d, the pressing portion 801d is pressed to engage and move the actuating arm 802d, thereby driving the corresponding portion 803d to be released from the butting portion 103d of the limiting member 10d and pressing the elastic portion 805d. Meanwhile, the rotating member 20a is rotated on the limiting member 10d by the release force of the elastic member 90a so that the rotating member 20a is automatically ejected by the driving of the elastic member 90a, allowing the positioning member 80d and the limiting member 10d to be unlocked and achieving fast coupling and easy detachment.

The present invention has been disclosed in the preferred embodiments above, however, it will be understood by those skilled in the art that these embodiments are intended to be illustrative of the invention only and should not be construed as limiting the scope of the invention. It should be noted that any equivalent changes and substitutions to the embodiments are to be considered within the scope of the present invention. Accordingly, the scope of the invention should be defined by the claims.

What is claimed is:

1. A rotary motion structure, comprising:
a limiting member having a mounting portion; and
a rotating member, rotatably provided at the limiting member and including a shaft portion, which is provided at the mounting portion;
wherein the limiting member is provided with a first limiting portion, and the rotating member is provided with a second limiting portion, and while the first limiting portion and the second limiting portion correspond to each other, the first limiting portion and the second limiting portion are interfering or buckling with each other to temporarily fix, temporarily limit, fix, or limit the rotating member, and the limiting member is provided with an engaging portion,
wherein the first limiting portion is provided with a limiting region and a guide region, which are used to guide an acting direction of the second limiting portion, and the second limiting portion is provided with a limiting region and a guide region, which are used to guide an acting direction of the first limiting portion,
wherein the first limiting portion is a protruding structure, the limiting region of the first limiting portion is a retaining wall at a side, and a bottom surface of the guide region of the first limiting portion is a curved surface adjacent to a side of the limiting region of the first limiting portion;
wherein the second limiting portion is a protruding structure, the limiting region of the second limiting portion is a retaining wall at a side, and a bottom surface of the guide region of the second limiting portion is a curved surface adjacent to a side of the limiting region of the second limiting portion;
wherein the limiting region of the second limiting portion moves or slides to the limiting region of the first limiting portion along the bottom surface of the guide region of the first limiting portion, and the limiting region of the first limiting portion moves or slides along the bottom surface of the guide region of the second limiting portion;
wherein the rotating member includes a head portion, which is integrated, combined, or formed integrally with the shaft portion, and the rotating member includes an operating portion, and the rotating member includes an acting portion, in which the operating portion, the acting portion, the shaft portion, and the head portion may be formed integrally or assembled together, and the rotating member includes an abutting portion, which is connected to the acting portion and has a protrusion, a recess, a bevel, an arc surface, a curved surface, a step, a groove, a recessed hole, a through hole, a cylinder or a sheet.

2. The rotary motion structure of claim 1, wherein an elastic member is further provided, and the elastic member is provided at the shaft portion with two ends thereof abutting against the limiting member and the rotating member respectively.

3. The rotary motion structure of claim 2, wherein the shaft portion is provided with a stop flange, which is located on one end of the shaft portion opposite the head portion for stopping against the elastic member.

4. The rotary motion structure of claim 3, wherein the limiting member has an interfering portion provided at a wall surface of the mounting portion of the limiting member for interfering with the stop flange, the head portion, or the elastic member mutually.

5. The rotary motion structure of claim 1, wherein the head portion and the shaft portion are fixed by an engaging piece.

6. The rotary motion structure of claim 2, wherein the elastic member is a torsion spring, two ends of which are fixed at the limiting member and the rotating member respectively for causing the rotating member to rotate elastically about the shaft portion due to the elastic force of torsion.

7. The rotary motion structure of claim 2, wherein the elastic member is a coil spring, a torsion spring, a shrapnel, or an elastic cylinder.

\* \* \* \* \*